(12) United States Patent
Lee

(10) Patent No.: US 11,226,278 B2
(45) Date of Patent: Jan. 18, 2022

(54) LEUKOCYTE QUANTITATION MICROFLUIDIC METHOD AND DEVICE

(71) Applicant: Kennesaw State University Research and Service Foundation, Inc., Kennesaw, GA (US)

(72) Inventor: Hoseon Lee, Marietta, GA (US)

(73) Assignee: Kennesaw State University Research and Service Foundation, Inc., Kennesaw, GA (US)

( * ) Notice: Subject to any disclaimer, the term of this patent is extended or adjusted under 35 U.S.C. 154(b) by 599 days.

(21) Appl. No.: 15/806,643

(22) Filed: Nov. 8, 2017

(65) Prior Publication Data

US 2018/0128728 A1    May 10, 2018

Related U.S. Application Data

(60) Provisional application No. 62/419,070, filed on Nov. 8, 2016.

(51) Int. Cl.
*G01N 15/10* (2006.01)
*B01L 3/00* (2006.01)
(Continued)

(52) U.S. Cl.
CPC .... *G01N 15/1031* (2013.01); *B01L 3/502707* (2013.01); *B01L 3/502715* (2013.01); *B01L 3/502761* (2013.01); *G01N 15/1056* (2013.01); *H05K 1/0272* (2013.01); *H05K 3/064* (2013.01); *B01L 2200/0647* (2013.01); *B01L 2200/12* (2013.01); *B01L 2300/0627* (2013.01);
(Continued)

(58) Field of Classification Search
CPC ......... G01N 15/1031; G01N 2015/008; G01N 2015/1006; G01N 15/1056; G01N 2015/1062; H05K 1/0272; H05K 3/064; H05K 1/165; B01L 2200/12; B01L 3/502761; B01L 3/502707; B01L 3/502715; B01L 2400/043; B01L 2300/0627; B01L 2200/0647; B01L 2300/0861; G06F 19/3418; G06F 21/602; G16H 10/60; H04L 9/01
See application file for complete search history.

(56) References Cited

U.S. PATENT DOCUMENTS 7,960,099 B2   6/2011   Xu et al.
8,017,078 B2   9/2011   Linssen et al.
(Continued)

FOREIGN PATENT DOCUMENTS

EP    2391450 A1    12/2011
WO    2015/132318 A1    9/2015

OTHER PUBLICATIONS

Hur et al., Deformability-based cell classification and enrichment using inertial microfluidics; Lab Chip, 2011, 11, 912-920; The Royal Society of Chemistry; 2011.
(Continued)

*Primary Examiner* — Lore R Jarrett
(74) *Attorney, Agent, or Firm* — Smith, Gambrell & Russell LLP

(57) ABSTRACT

A microfluidic solenoid point of use device for discrete quantitation of magnetized cells. The inventive device provides higher accuracy, lower cost, and less bulk than other counting devices.

14 Claims, 24 Drawing Sheets
(22 of 24 Drawing Sheet(s) Filed in Color)

(51) Int. Cl.
  *H05K 3/06* (2006.01)
  *H05K 1/02* (2006.01)
  *G01N 15/00* (2006.01)
  *H05K 1/16* (2006.01)

(52) U.S. Cl.
  CPC .............. *B01L 2300/0861* (2013.01); *B01L 2400/043* (2013.01); *G01N 2015/008* (2013.01); *G01N 2015/1006* (2013.01); *G01N 2015/1062* (2013.01); *H05K 1/165* (2013.01)

(56) References Cited

U.S. PATENT DOCUMENTS

| | | | |
|---|---|---|---|
| 8,158,728 | B2 | 4/2012 | Desimone et al. |
| 8,329,453 | B2 | 12/2012 | Battrell et al. |
| 8,417,465 | B2 | 4/2013 | Prabhakarpandian et al. |
| 8,444,899 | B2 | 5/2013 | DeSimone et al. |
| 8,718,956 | B2 | 5/2014 | Hesketh et al. |
| 9,029,158 | B2 | 5/2015 | Tai et al. |
| 9,149,806 | B2 | 10/2015 | Collins |
| 9,176,137 | B2 | 11/2015 | Quake et al. |
| 2006/0250604 | A1 | 11/2006 | Hamada et al. |
| 2008/0247908 | A1* | 10/2008 | Kahlman ............ G01N 15/0656 422/68.1 |
| 2010/0109686 | A1* | 5/2010 | Zhe ...................... G01M 13/02 324/698 |
| 2010/0136669 | A1* | 6/2010 | Weekamp ............ G01N 27/745 435/287.2 |
| 2010/0190654 | A1 | 7/2010 | Rothrock et al. |
| 2011/0028341 | A1 | 2/2011 | Wang et al. |
| 2013/0228950 | A1 | 9/2013 | DeSimone et al. |
| 2014/0008307 | A1* | 1/2014 | Guldiken .......... B01L 3/502761 210/748.05 |
| 2014/0308207 | A1 | 10/2014 | Janetopoulos et al. |
| 2015/0031120 | A1* | 1/2015 | Foster ............... B01L 3/502738 435/288.7 |
| 2015/0177122 | A1* | 6/2015 | Foster ................ G01N 15/1484 435/309.1 |
| 2015/0226657 | A1* | 8/2015 | Foster .................... G01N 15/10 435/287.1 |

OTHER PUBLICATIONS

Gossett et al., Label-free cell separation and sorting in microfluidic systems; Anal Bioanal Chem (2010) 397:3249-3267; Springer.
Holmes et al., Leukocyte analysis and differentiation using high speed microfluidic single cell impedance cytometry; Lab Chip, 2009, 9, 2881-2889; The Royal Society of Chemistry 2009.
Holmes et al.; Leukocyte analysis and differentiation using high speed microfluidic single cell impedance cytometry; Lab Chip, (2009), Abstract, 2 pages.
Shi et al., Four-part leukocyte differential count based on sheathless microflow cytometer and fluorescent dye assay; Lab Chip, 2013, 13, 1257-1265; RSC Publishing.
Lawrence, Stacy, MIT researchers develop noninvasive, fingertip device to count white blood cells in real time; Fierce Medical Devices; Oct. 1, 2015; pp. 1-2; http://www.fiercemedicaldevices.com: U.S.
Dubay, Lee; Optical sensor-driven device can count white blood cells through the skin; BioOptics World; Oct. 1, 2015; pp. 1-4; PennWell Corporation, Tulsa, OK, U.S.
Fesenmaier, Kimm, Counting White Blood Cells at Home; Caltech; Mar. 26, 2013; pp. 1-2.
Novel portable device counts white blood cells in real time; News Medical Life Sciences & Medicine; Sep. 30, 2015; pp. 1-3; http://www.news-medical.net/news; U.S.
Anderson et al., Fabrication of Topologically Complex Three-Dimensional Microfluidic Systems in PDMS by Rapid Prototyping, Anal. Chem., vol. 72 No. 14, p. 3158-3164, 2000.
Kartalov et al., Microfluidic vias Enable Nested Bioarrays and Autoregulatory Devices in Newtonian Fluids, Proc. Nat'l Acad. Sci. US Am., vol. 103 No. 33, p. 12280-12284. 2006.
Sun et al., Paramagnetic Structures within a Microfluidic Channel for Enhanced Immunomagnetic Isolation and Surface Patterning of Cells, Scientific Reports, vol. 6, 9 pages, Jul. 2016.
Luharuka et al., Simulated and experimental dynamic response characterization of an electromagnetic microvalve, Sensors and Actuators A Phys., vol. 143, No. 2, pp. 399-408, 2008.
Owen et al., Rapid microfluidic mixing via rotating magnetic microbeads, Sensors Actuators A Phys., vol. 251, pp. 84-91, 2016.
Kommandur et al., Metal-coated glass microfiber for concentration detection in gas mixtures using the 3-Omega excitation method, Sensors Actuators A. Phys., vol. 250, pp. 243-249, Oct. 2016.
Hesketh et al. High-pressure quartz crystal microbalance, 2014 (see U.S. Pat. No. 8,718,956B2).
Ballard et al., Orbiting magnetic microbeads enable rapid microfluidic mixing, Microfluid Nanofluidics vol. 20, No. 6, 13 pages, 2016.
Hesketh et al. Mixing apparatus for gases, 4 pages, 2013.
Hesketh et al., The development and multiple uses of a standardised bioassay method to select hypocrealean fungi for biological control of aphids, Biol. Control, vol. 46, pp. 242-255, Jan. 2008.
Luharuka and Hesketh, Design of fully compliant, in-plane rotary, bistable micromechanisms for MEMS applications, Sensors Actuators A. Phys., vol. 134, pp. 231-238, Jan. 2007.
Allendorf and Hesketh, Method and apparatus for detecting an analyte, 5 pages, 2011.
Venkatasubramanian et al., MOF @ MEMS: Design optimization for high sensitivity chemical detection, Sensors Actuators B. Chem., vol. 168, pp. 256-262, Jun. 2012.
Brazzle et al., Hollow Metallic Micromachined Needle Arrays., Biomed. Microdevices, vol. 2, No. 3, p. 197-205, Jun. 2000.
Ayliffe et al., Electric impedance spectroscopy using microchannels with integrated metal electrodes, J. Microelectromechanical Syst. vol. 8, No. 1, p. 50-57, 1999.
Frazier et al., Surface micromachined microneedles, 5 pages, 2006.
Beavis et al., P-4.10: Quantitation of leukocyte subsets in non-human primate peripheral blood using a single-tube, 8-colour flow cytometry assay, Toxicol. Lett., vol. 229, No. Supplement, p. S206, Sep. 2014.
Hosseini et al., Microfluidic device for label-free quantitation and distinction of bladder cancer cells from the blood cells using micro machined silicon based electrical approach; suitable in urinalysis assays, J. Pharm. Biomed. Anal., vol. 134, pp. 36-42, Feb. 2017.
Differential immuno-capture biochip offers specific leukocyte counting for HIV diagnosis, AIDS Weekly, NewsRX LLC, 3 pages 2016.
Hassan et al., Microfluidic differential immunocapture biochip for specific leukocyte counting, Nat. Protoc. vol. 11, No. 4, p. 714-726, 2016.
Tang et al., Microfluidic impedance cytometer with inertial focusing and liquid electrodes for high-throughput cell counting and discrimination, Anal. Chem. vol. 89, No. 5, p. 3154-3161, 2017.
Hassan and Bashir, Electrical cell counting process characterization in a microfluidic impedance cytometer, Biomed. Microdevices, vol. 16, No. 5, pp. 697-704, Oct. 2014.
Damhorst et al., Research: Smartphone-Imaged HIV-1 Reverse-Transcription Loop-Mediated Isothermal Amplification (RT-LAMP) on a Chip from Whole Blood, Engineering, vol. 1, No. Special Section: Medical Instrumentation, pp. 324-335, Sep. 2015.
Tay et al., Research review paper: Advances in microfluidics in combating infectious diseases, Biotechnol. Adv., vol. 34, pp. 404-421, Jul. 2016.
Antfolk and Laurell, Review: Continuous flow microfluidic separation and processing of rare cells and bioparticles found in blood—A review, Anal. Chim. Acta, vol. 965, pp. 9-35, May 2017.
Pui et al., High density CMOS electrode array for high-throughput and automated cell counting, Sensors Actuators B. Chem., vol. 181, pp. 842-849, May 2013.
Alazzam et al., Novel microfluidic device for the continuous separation of cancer cells using dielectrophoresis, J. Sep. Sci. vol. 40, No. 5, p. 1193-1200, 2017.

(56) References Cited

OTHER PUBLICATIONS

Hung et al., An integrated microfluidic platform for rapid tumor cell isolation, counting and molecular diagnosis, Biomed. Microdevices, pp. 339-352, Jan. 2013.
Sarioglu et al., A microfluidic device for label-free, physical capture of circulating tumor cell clusters, Nat. Methods vol. 12, No. 7, 11 pages, 2015.
Terrell-Hall et al., Permeability across a novel microfluidic blood-tumor barrier model, Fluids Barriers CNS vol. 14, No. 3, 11 pages, 2017.
Gogoi et al., Development of an Automated and Sensitive Microfluidic Device for Capturing and Characterizing Circulating Tumor Cells (CTCs) from Clinical Blood Samples., PLoS One, vol. 11, No. 1, pp. 1-12, Jan. 2016.
Xu et al., A review of impedance measurements of whole cells, Biosens. Bioelectron., vol. 77, pp. 824-836, Mar. 2016.
Castillo-Fernandez et al., High-speed counting and sizing of cells in an impedance flow microcytometer with compact electronic instrumentation, Microfluid. Nanofluidics vol. 16, No. 1-2, p. 91-99, 2014.
Biotechnology; Findings on Biomedicine and Biomedical Engineering Detailed by Investigators at University of Illinois, Electrical cell counting process characterization in a microfluidic impedance cytometer, Biotech Week, NewsRX LLC, 3 pages, 2014.
Chan and Qiu, Cell counting and sample chamber and methods of fabrication, 2 pages, 2015.
Dupont et al., Fluorescent magnetic bead and cell differentiation/counting using a CMOS SPAD matrix, Sensors Actuators B. Chem. vol. 174, p. 609-615, 2012.
Kim et al., A portable somatic cell counter based on a multifunctional counting chamber and a miniaturized fluorescence microscope, Talanta, vol. 170, pp. 238-243, Aug. 2017.
Shourav, et al., Wide field-of-view fluorescence imaging with optical-quality curved microfluidic chamber for absolute cell counting, Micromachines, vol. 7, No. 7, 16 pages, Jul. 2016.
Vazquez et al., A novel procedure of quantitation of virus based on microflow cytometry analysis., Appl. Microbiol. Biotechnol., vol. 100, No. 5, pp. 2347-2354, Mar. 2016.
Fernández-Baldo et al., Nanostructured platform integrated into a microfluidic immunosensor coupled to laser-induced fluorescence for the epithelial cancer biomarker determination, Microchem. J., vol. 128, pp. 18-25, Sep. 2016.
D. Garcia, et al., Counting cells with a low-cost integrated microfluidics-waveguide sensor, Biomicrofluidics, vol. 6, No. 1, 4 pages, Mar. 2012.
He et al., Digital Microfluidics for Manipulation and Analysis of a Single Cell, Int. J. Mol. Sci., vol. 16, No. 9, pp. 22319-22332, Sep. 2015.
Liu et al., Microfluidic magnetic bead assay for cell detection, Anal. Chem. vol. 88, No. 1, p. 711-717, 2016.
Ouyang et al., Rotation-Driven Microfluidic Disc for White Blood Cell Enumeration Using Magnetic Bead Aggregation, Anal. Chem., vol. 88, No. 22, pp. 11046-11054, Nov. 2016.
Liu et al., In situ single cell detection via microfluidic magnetic bead assay, PLoS One, vol. 12 No. 2, p. 1-18, 2017.
Prabhakakarpandian et al., Synthetic microfluidic blood-brain barrier, 2013 (see U.S. Pat. No. 8,417,465B2).
Ruffert, Magnetic Bead—Magic Bullet, Micromachines, vol. 7 No. 2, 17 pages, 2016.
Ho, Micro/Nano Technology Systems for Biomedical Applications: Microfluidics, Optics, and Surface Chemistry, Oxford: OUP Oxford, 60 pages 2010.
DeSimone et al., Methods and materials for fabricating microfluidic devices, 2013 (see US pub No. 2013/0228950A1).
Kratt et al., High aspect ratio PMMA posts and characterization method for micro coils manufactured with an automatic wire bonder, Sensor Actuators A. Phys.; vol. 156, p. 328-333, 2009.
Mohmmadzedeh et al., Characterization of a 3D MEMS fabricated micro-solenoid at 9.4T, Journal Magn. Reson., vol. 208, p. 20-26, 2011.
Spengler et al., Heteronuclear Micro-Helmholtz Coil Facilitates pm-Range Spatial and Sub-Hz Spectral Resolution NMR of nL-Volume Samples on Customisable Microfluidic Chips, PLoS One, vol. 11 No. 1, p. 1-16, 2016.
Rasera et al., Fabrication of microfluidic vias by mechanical compression and controlled peeling, 18th Int'l Conf. on Miniaturized Systems for Chemistry and Life Sciences, p. 1722-1724, 2014.
Akbarzadeh et al., Magnetic nanoparticles: preparation, physical properties, and applications in biomedicine, Nanoscale Res. Lett., 7:144, (2012).
Gutow, Halide (Cl-) Quenching of Quinine Sulfate Fluorescence: A Time-Resolved Fluorescence Experiment for Physical Chemistry, J. Chem. Educ. 82:302, (2005).
Merck KGaA, "Magnetic Materials", available online at <https://www.sigmaaldrich.com/materials-science/material-science-products.html?TablePage=112180535>, 2017.
Nvigen, Inc., "Product Lines of NVIGEN's Nanopbeads Technology", available online at <https://www.nvigen.com/products/ >, 2011-2017.
O'Reilly, Fluorescence experiments with quinine, J. Chem. Educ. 52:610, (1975).
Sacksteder et al., Photophysics in a disco: Luminescence quenching of quinine, J. Chem. Educ., 67:1065, (1990).

\* cited by examiner

LEUKOCYTE QUANTITATION MICROFLUIDIC METHOD AND DEVICE

This application claims priority to U.S. Ser. No. 62/419,070 which is expressly incorporated by reference herein in its entirety.

Microfluidic-based diagnostic devices offer significant savings in terms of reagent costs, speed, and ease of use. However, significant challenges remain when considering the competing constraints of throughput, portability, and accuracy.

The invention is a new method of cell counting and characterization using magnetized target cells flowing through a microfluidic solenoid. The inventive method and device uses a microfluidic solenoid which measures the electrical signals induced by the change of magnetic permeability from magnetized target cells. For example, in use, a target leukocyte is magnetized using magnetic nanoparticles coated onto a protein that has a specific antigen that binds the antibody of the target leukocyte. A different target leukocyte is magnetized using a different magnetic nanoparticle on a protein that has the corresponding antigen for the different target leukocyte. This enables differentiation among the different leukocyte types.

The inventive quantitation device for a target cell population comprises at least one microfluidic solenoid that measures electrical signals induced by a change of magnetic permeability from a target cell population that has been magnetized. The microfluidic solenoid houses a conductive vertical interconnect access (via) for the discrete passage of the target cell population therethrough, and operatively contacts a plurality of metal coils, e.g., by wrapping the coils around the solenoid and securing the metal coils to the conductive via by a conductive wire, or inserting the coils in grooves on the surface of the solenoid, or drawing vias that penetrate shells of the solenoid, forming a closed conductive loop around a microfluidic channel, in any case forming a closed conductive loop around a microfluidic channel. A source of current is provided to the solenoid, such that a sample containing magnetized target cells flowing through the via in the solenoid produces a series of discrete changes in voltage induced by changes in permeability resulting from the magnetized target cells flowing therethrough. Executing computer readable instructions causes quantitation of the number of discrete voltage changes, which indicate the number of target cells in the target cell population.

In one embodiment, the inventive quantitation device comprises a microfluidic channel; at least one microfluidic solenoid that measures electrical signals indicative of a magnetic permeability or a change in magnetic permeability of a target cell population that is magnetized, and where the microfluidic solenoid houses a conductive via for passage of at least a portion of the target cell population; a plurality of conductive coils disposed around or otherwise in electric contact with the microfluidic solenoid, the conductive coils coupled to the conductive via by a conductive lead such that a closed conductive loop is formed around the microfluidic channel. A source of electrical current energizes the solenoid such that at least a portion of the target cell population flowing through the via produces one or more discrete changes in voltage indicative of the magnetic permeability or change in magnetic permeability of the portion of the target cell population flowing through the via. Upon executing computer readable instructions, the device quantitates the number of discrete voltage changes, which are indicative of the number of target cells in the portion of the target cell population.

The device may be configured as interconnectively stacking a number of the microfluidic solenoids. This embodiment provides parallel processing and high throughput. A single device may have horizontal arrays, vertical arrays, or both horizontal arrays and vertical arrays of microfluidic channels. One embodiment is a method for quantitating target cells in a sample, e.g., a blood sample. The method uses a microelectromechanical system (MEMS) to fabricate one or more microfluidic solenoids, each solenoid housing a conductive via therethrough, and each having a plurality of metal coils around or otherwise contacting the solenoid and secured to the conductive vias by a conductive wire. This results in a closed conductive loop around the microfluidic channel. In use, the sample containing a plurality of magnetized target cells through the via in the solenoid produces a series of discrete changes in voltage, with the voltage provided by a direct current power source/The changes in voltage are induced by changes in permeability resulting from the magnetized target cells flowing therethrough, and provide a direct current power source to the microfluidic-based solenoid coils. The number of signals, which correlate with the number of discrete target cells, are quantitated and provided. Samples may be sequentially processed. The inventive device quantitates cells without a laser source. A counting system converts the voltage to number of cells.

In one embodiment, leukocytes present in a blood sample are the target cell population.

The inventive device is a point of care device that sorts, differentiates, and quantitates a plurality of leukocytes in a patient blood sample, the leukocytes rendered magnetized, the device using a plurality of interconnected microfluidic channels detecting a discrete change of voltage for quantitating each magnetized leukocyte in the patient blood sample. The device may be fabricated by preparing at least two microfluidic channels fabricated with at least one metal coil around each of microfluidic channels, reducing the bulk of the device facilitating point of care leukocyte detection. The coil around each microfluidic channel is secured by a conductive wire and a conductive via to complete the closed conductive loop around the microfluidic channel. Stacking at least two channels results in a three dimensional (3D) structure that processes leukocytes in parallel to achieve higher leukocyte quantitation accuracy due to a leukocyte prompted change in voltage being discrete thus counting each leukocyte. Fabricating coils around each microfluidic channel creates a transformer integrated in the microfluidic channel. The device may further have an analyzing unit.

Fabrication comprises applying a photoresist material on a cleaned printed circuit board; applying a mask with a design of a microfluidic channel with ultraviolet light to result in a patterned photoresist material; developing the patterned photoresist material; transferring the developed patterned photoresist material to the printed circuit board and etching the pattern; stripping the photoresist material out of the substrate, and optionally placing a second cleaned printed circuit board without a pattern on the printed circuit board with the etched channel and sealing the channel. A top cover printed circuit board with metal coils is integrated to cover a bottom portion of a microfluidic channel. Photolithography and metal deposition are used to fabricate the coil that forms the transformer around a microfluidic channel.

Sequential metal coil fabrication results in a chip; the steps include applying a photoresist material on the printed circuit board chip; applying a mask with a design of metal coils with ultraviolet light to pattern the photoresist material; developing the patterned photoresist material and transferring to the printed circuit board; depositing gold or another metal on the substrate, stripping the photoresist material out of the printed circuit board chip to show metal electrodes on the printed circuit board; and connecting a top electrode on one printed circuit board to a bottom electrode on an adjacent printed circuit board by a vertical interconnect access (via) to form a closed metal coil loop.

Cells, e.g., leukocytes, are magnetized by binding magnetic-coated nanoparticles to the cells by a receptor protein specific to the cell by antigen-antibody interaction.

An innovative microelectromechanical system (MEMS) based microfluidic fabrication technique creates microfluidic solenoids that can either used individually or can be stacked vertically for high throughput and parallel processing that is unachievable with fluorescence or impedance cytometry. The inventive fabrication technique provides a platform for creating the first vertically-stacked, three dimensional, microfluidic "digital" computer that can discretely quantitate any target cells.

Magnetized cells can produce electrical surges induced by change in magnetic permeability in a scale as small as microfluidic-based solenoid coils. Sensitivity of the electromagnetic sensing mechanism is quantified through parametric simulation of cell velocity, size, and magnetic permeability of magnetic beads, and dimensions of solenoid coils.

Use of the inventive system results in point-of-care diagnosis via a portable cell quantitation device that does not require a light source for sensing and only requires a DC voltage source from a battery. Devices currently used, such as flow cytometry, in contrast are large, bulky, heavy, and expensive. For cancer patients or high-risk patients who need frequent white blood cell count monitoring, such a point of care device saves cost and time, and alleviates patient stress and inconvenience.

The inventive method counts and characterizes target cells or cell populations by magnetizing the target cells flowing through a microfluidic solenoid. Such manipulation of low fluid volumes achieves multiplexing, automation, and high-throughput screening capabilities in a point of care in vitro diagnostic for sorting, differentiating, and quantitating, e.g., leukocytes, also known as white blood cells (WBC). Clinical applications include a lab-on-a-chip system for point-of-care disease diagnosis and management.

Current leukocyte counting methods are time-consuming and rely on bulky instruments and trained personnel. Current microfluidic-based cell quantitation methods have only partially met the challenges of throughput, accuracy, and portability; these include fluorescence cytometry, impedance cytometry, waveguides, and complementary metal-oxide-semiconductor (CMOS) electrode arrays that use relatively simple microfluidic fabrication techniques, and many require light sources such as lasers.

For example, impedance flow cytometry measures the impedance of electric cell-substrate, which still requires lasers and a significant power source. Fluorescence cytometry is a fluorescence-based detection system and method for counting blood cells by capturing and isolating target blood cells flowing through a microfluidic chip and detecting light emitted by the captured target blood cells with simple microfluidic handling. The microfluidic channels used in both cytometry methods are not scalable for higher throughput due to their dependence on a single nozzle and a laser as a light source. Microfluidic waveguides are fabricated by ion exchange in glass that underlies a microfluidic structure for capturing cells. Laser light transmitted through the waveguide is attenuated by the number of metal nanoparticles tagged to the cells because of the interaction of the metal particles with the evanescent field of the waveguide. A high-density electrical-impedance spectroscopy (EIS) biosensor array has electrodes that are electrically addressable by a decoding circuit built underneath by 0.18 μm CMOS process. Digital microfluidics (DMF) manipulates individual droplets holding minute reagents and cells of interest by electric forces for analysis of a single cell and for efficient genetic screening, but with very low throughput.

A rapid, low-cost, and portable solution is in high demand for a point of care test.

The inventive device meets these needs using microfluidics and is based on a discrete change of voltage that counts each leukocyte in a patient sample. A novel microelectromechanical system (MEMS) fabrication process uses coils around microfluidic channels, creating a three dimensional array of vertically stackable microfluidic elements functioning as a "digital" computer, so named due to the discrete surges of electrical signals induced by the passing of cells. The result is a device with comparatively decreased bulk, as well as increased throughput and decreased cell quantitation time.

The inventive microfluidic solenoid-based cell quantitation device uses the magnetic permeability of cells that are labeled with magnetic nanobeads. The solenoid fabrication involves coils wrapped around the microfluidic channel, subsequently disclosed. Optimal device dimensions are determined using COMSOL Multiphysics® Simulation Modeling Software simulations of magnetic beads through various channel dimensions. Device validation is by comparison of quantitation results with flow cytometry using fluorescent cell labeling.

The magnetic permeability of cells magnetized with nanobeads induces a detectable magnetic field change in the solenoid, which serves as the discrete sensing mechanism. Vertically stacked microfluidic solenoids, resulting in three dimensional arrays of sensing channels, provide both high throughput and portability of the inventive device. The number of solenoids stacked depends on the amount of force that can be applied to the device to pull or push the fluid with the target cells through the solenoids. The number of coils that can be wound around each solenoid depends on the solenoid length; e.g., longer solenoids may have more coils that can be wrapped around it. The solenoid length depends on the amount of force necessary to push or pull the liquid containing the cells through the solenoid. The limitation on this force depends on the device, e.g., a vacuum pump, that can be used to pull the liquid through the solenoid.

The invention uses microfluidic solenoids to discretely quantitate cells labeled with magnetic nanobeads, and measures the discrete surges for each passage of the magnetized cell as each cell passes "single file". The cells are counted by counting the change of magnetic flux density using a counter circuit. The induced voltage and current in the coil is the input signal to a circuit that compares the input voltage to a baseline reference voltage of zero volts or reference current of zero amperes. A deviation from this baseline above a certain threshold indicates the presence of a cell, which has caused the change in magnetic flux density. A microcontroller saves the number of counts by updating the count each time a change in the voltage or current has occurred.

The microfluidic device can quantitate any target cell using different magnetically-tagged antibodies and other proteins. The magnetic field disruption occurs in a scale as small as microfluidic solenoids with magnetized cells, and is a basis for MEMS fabrication methods for vertically stacked, three dimensional microfluidic arrays of solenoids, applied in massively parallel cell analysis devices.

Leukocytes are divided into granulocytes and non-granulocytes, so named depending upon whether the cytoplasm contains granules visible upon staining. The granulocytes are neutrophils, eosinophils, and basophils. The non-granulocytes are lymphocytes and monocytes. For each of the five specific types of leukocyte, a specific antibody and antigen is required for the binding reaction. Therefore, to target this specific type of leukocyte, the specific cellular protein that is used as the antibody is bound to magnetic nanoparticles. This ensures that only a specific type of leukocyte will be magnetized. To target a different type of leukocyte, a different specific cellular protein that has the specific antibody for the target leukocyte is bound to magnetic particles. To differentiate among the five different types of leukocytes, the blood sample is divided into five sub-samples, each of which uses a different cellular protein that is magnetized.

In one embodiment, antibodies bound to magnetic nanoparticles are deposited into a separate vial containing the blood sample and mixed; these are prepared to magnetize the target cells before being deposited into the microfluidic chip. In another embodiment, both the antibodies and the blood sample are deposited into the microfluidic chip, which can have a pre-counting, cell preparation stage to mix and magnetize the target cells before the microfluidic chip enables flow of blood for cell counting.

Examples of nanoparticles are known in the art, and include but are not limited to quantum dots, nanobeads, nanospheres, etc., e.g., available at www.ncbi.nlm.nih.gov/pmc/articles/PMC3312841; www.sigmaaldrich.com/materials-science/material-science-products.html?TablePage=112180535; www.nvigen.com/products.php.

In one embodiment, the permeability of the magnetic material bound to the protein that attaches to the white blood cells creates a change in the magnetic field in the coil. This change of the magnetic field induces a change in current, which is the sensing mechanism for the presence of a white blood cell.

In one embodiment, multiple white blood cells bind to multiple magnetic materials creating a larger change in the magnetic field and a larger change in the current in the coils. A larger change in magnetic field or current thus represents a count of white blood cells greater than one.

One embodiment fabricates a coil wrapped around a microfluidic channel using conductive wires and conductive vias or channel paths to complete the closed conductive loop around the microfluidic channel. The wires and vias can be made using any metal such as copper. Alternatively, vias holes are through different electrically conductive materials if there are various layers within the microfluidic channel, and plates have holes that are aligned and aligned with electrically conductive traces on printed circuit boards (PCB) on each end of the microfluidic channel.

The inventive method is performed and results are obtained at the point of care. This obviates the need for professional laboratory methods with their attendant expenses due to specialized equipment and personnel and high cost reagents, and the attendant delay in providing patient results.

Previous point of care methods for cell differentiation and quantitation were based on labeling cells with a fluorescent dye and measuring the light intensity of the labeled cells using a laser. Different fluorescent dyes, producing different colors, helped to differentiate cell types, and the intensity of the light was used to generate cell counts. Most cell counters use a laser to measure the light emitted or luminosity from chromophores bound on the cell surface through specific biomarkers on the cell surface. This light-based process had several disadvantages. The light intensity can be affected by several factors such as the presence, composition, and/or concentration of solutes in the buffer. Fluorescent quenching could occur due to extended immersion times in salt buffer solution, reducing detection sensitivity; chloride ion is a well known quencher for quinine fluorescence. The nanoparticle-labelled antibodies must remain at proper pH, salt concentration, and temperature to maintain their ability and activity to recognize specific markers on cells and to properly bind to cells. The salt buffer may quench fluorescence during the labeling process (O'Reilly, Fluorescence experiments with quinine, J. Chem. Educ. 52 (1975) 9 p. 610, Photophysics in a disco: Luminescence quenching of quinine, J. Chem. Educ., 67 (1990) 12 p. 1065, Halide (Cl—) Quenching of Quinine Sulfate Fluorescence: A Time-Resolved Fluorescence Experiment for Physical Chemistry, J. Chem. Educ. 82 (2005) 2 p. 302), resulting in incomplete excitation of the attached chromophore and background light from free chromophore in solution. Dye-based devices, to excite the chromophore, must be equipped with single or multiple laser light sources, increasing the bulk size of the device. Light emitted from the fluorescence dye must be transmitted through the precise light path and transformed into electrical signals to be processed by the detection system, components of which also add to the bulk size of the device. Such optical and electrical components are expensive, adding to the cost of commercially available products in addition to the cost of the fluorescent dyes, and the cost for each assay or diagnosis.

The inventive method and system uses a point of care microfluidic device that is less bulky, less expensive, and faster in each test. The device and system creates a diagnosis strategy ultimately engaged to clinical application. The method enables specific leukocyte quantitation at any location, even at home, without the need to travel to a clinic or hospital. Conventional hospital or clinic leukocyte quantitation processes are slow, expensive, and cumbersome. Bypassing conventional hospital procedures permits a patient to provide critical leukocyte quantitation to a physician, facilitating diagnosis and/or therapy. The inventive device and system provides a more efficient diagnosis strategy that can lead to the proper prognosis.

The device is fabricated in a novel process that uses coils around microfluidic channels, decreasing the device bulk compared to other devices. Fabrication of coils around microfluidic channels creates transformers integrated in microfluidics. Three dimensional stacked microfluidics for parallel processing achieves higher accuracy because the change in voltage is discrete and counts each and every cell separately, compared to devices that count cells based on light intensity. The inventive microfluidic cell counter device is a digital, versus an analog, cell counter. Further, the microfluidic device does not require a laser light source, significantly decreasing cost as well as decreasing the device size and bulk.

The inventive microfluidic device contains metallic, conductive coils wrapped around the microfluidic channels. The new fabrication method uses a microfluidic channel sandwiched between two printed circuit boards (PCB) onto which metallic conductive traces are etched. The top PCB has conductive traces facing downward, and the bottom PCB has conductive traces facing upward that are aligned with the top PCB. Then metallic vias are used to connect the top PCB with the bottom PCB. This completes the square or rectangular shaped loops around the microfluidic channel. More loops induce higher current through the loops when a magnetic material passes through.

A variation of this device is the use of transformers. A secondary channel can be developed adjacent to the primary channel with a small gap, as shown in FIGS. 5-7. In this embodiment of the device, the voltage and current induced in the secondary channel is used to sense the presence of a cell.

An analyzer unit is integrated with the microfluidic device. The voltage and current outputted from the microfluidic device is inputted into a circuit in the analyzer unit that counts the number of times the voltage/current changes. The counter then relays the number of counts into a chip that stores the information as digital bits. A microcontroller is used to access the stored data that contains the number of cells that have been processed. The method of determining leukocyte counts based on the number of voltage/current changes is based on a comparator circuit, which compares the voltage/current to a reference voltage/current to determine any change. The output of the comparator is a "1" or a "0". This output is fed into a microcontroller that stores the 1's into a register or memory that continuously is updated as the magnetized cells continue to pass through the solenoid and triggers the comparator circuit.

This inventive sensing and quantitation mechanism uses, at its core, change in permeability to induce a change in voltage and current. It does not require the use of lasers, and is digital, unlike analog conventional color-dying methods where the dye intensity translates to the number of cells present, but where the intensity can vary continuously it is not a discrete counting method.

This claimed method uses discrete voltage and current changes, and is inherently discrete in nature when quantitating cells so is thus more accurate. It eliminates the need for lasers, which are bulky and expensive, and thus changes the paradigm of cell counting technology.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Figure 1:
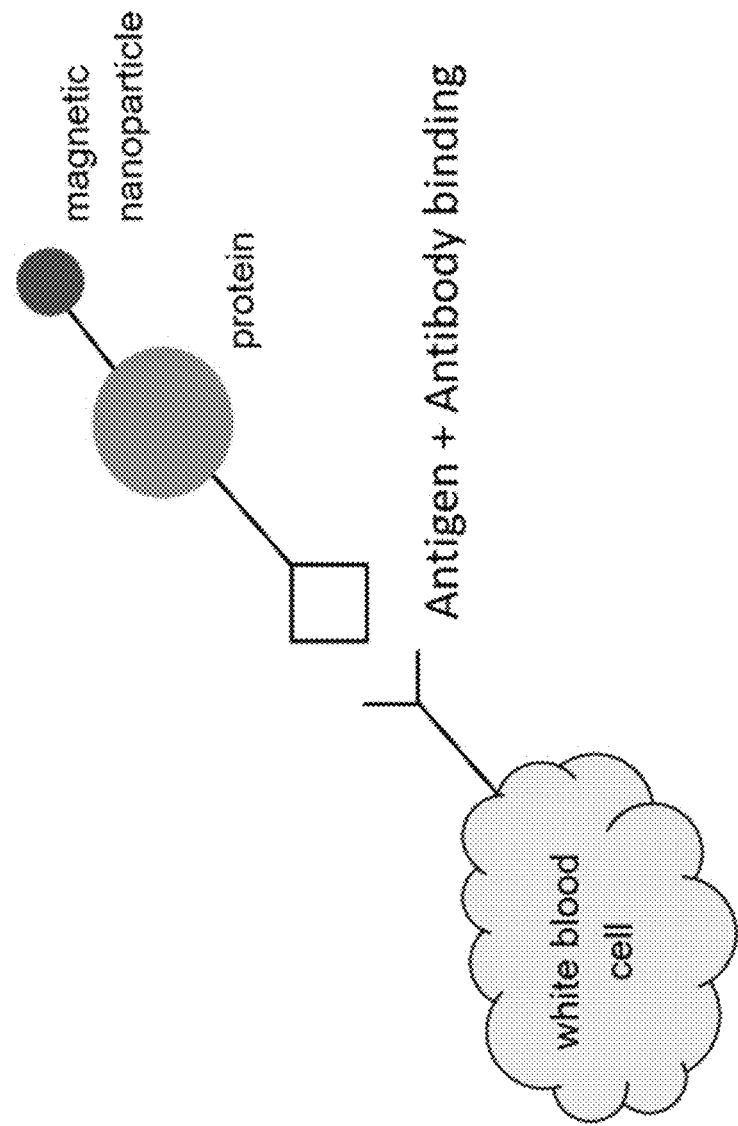
FIG. 1 schematically shows a white blood cell becoming magnetized by binding, by an antibody-antigen reaction, with a cellular protein to which a magnetic nanoparticle is bound, resulting in a magnetic bead with permeability μ.

Microfluidic solenoids discretely quantitate magnetized cells, and microfluidic-based diagnostic devices offer significant savings in terms of reagent costs, speed, and ease of use. However, significant challenges remain when considering the competing constraints of throughput, portability, and accuracy. This inventive device addresses all of these challenges simultaneously, using a microfluidic solenoid which measures the electrical signals induced by the change of magnetic permeability from magnetized target cells, in this case, leukocytes. Previous methods, including fluorescence-based cytometry, impedance cytometry, waveguides, and CMOS-based decoding of cells in electrodes rely on relatively simple microfluidic fabrication techniques.

The inventive microfluidic fabrication technique for creating microfluidic solenoids that can be stacked vertically for parallel processing yields high throughput unachievable with fluorescence or impedance cytometry. The inventive fabrication technique provides a platform for a vertically-stacked, three-dimensional, microfluidic "digital" computer that can discretely quantitate any target cells.

As subsequently disclosed, the inventive method and device uses induced electrical signals due to change in magnetic permeability, based on the sound physics of Faraday's law, and which is used in electromagnets and solenoids in power adapters and power transmission. The alignment and bonding of the vertical vias in the microfluidic channel to the top and bottom conductors create the coils around the microfluidic channel, achieved based on wire-bonding techniques used in microchips.

Magnetized cells can produce electrical surges induced by change in magnetic permeability in a scale as small as microfluidic-based solenoid coils. The inventive microfluidics fabrication technique creates microfluidic solenoids and vertically-stacked three-dimensional microfluidic arrays for parallel processing, and ultimately, high throughput.

Sensitivity of the electromagnetic sensing mechanism is quantified as follows. The magnitude of the signal generated due to the passing of a magnetized white blood cell through a set of coils or solenoid is calculated to be in the range of nanovolts, which can be increased using transformers and amplifiers. COMSOL Multiphysics® simulation software is used to quantify the magnitude of the induced electrical signals as the cell passes through the coils. A parametric study of cell velocity, size, and magnetic permeability of magnetic beads, dimensions of solenoid coils optimizes the design to increase cell detection sensitivity. The end user device is calibrated by sending a liquid without any magnetized cells through the solenoid. This creates the baseline voltage and current for the comparator circuit which uses it to compare the voltage and current that are induced from magnetized cells.

Microfluidic solenoid design fabrication optimization creates solenoids around a microfluidic channel. There should be optimal alignment of the vias through the top PCB, microfluidic channel, and bottom PCB, and mechanically sound contacts. There are fabrication steps for two solenoids with different number of turns to make microfluidic transformers, to control the magnitude of the voltage or current on the output.

Validation is achieved by measurements using the inventive method and existing fluorescence-based cell quantitation. Two different sets of tests are conducted using target cells magnetized with fluorescent and magnetic beads. One set of tests uses the inventive microfluidic solenoid to discretely count each cell based on electrical signals induced by change in magnetic permeability. Another set of tests uses flow cytometry using the Sony Biosciences SH800 cell sorter and BD Acurri C6 Flow Cytometer equipment.

Magnetic beads are small spherical magnetic particles with superparamagnetic properties. Magnetic bead assays and micro Coulter® counters are used to identify single cells in terms of the transit time difference of the cell through the two micro Coulter counters. Target cells are conjugated with magnetic beads via specific antibody and antigen binding. A target cell traveling through the two Coulter counters interacts with the magnetic field, and had a longer transit time at the first counter than at the second counter. In comparison, a non-target cell has no interaction with the magnetic field, and hence has nearly the same transit times through the two counters. This method is expected to enable single cell detection in a continuous flow and can be applied to facilitate general cell detection applications such as stem cell identification and counting and characterization. However, due to the use of transit time differentiation and device fabrication, it is difficult to scale up for higher throughput and faster counting time, and does not lend itself to parallel applications.

TABLE 1

Comparison of state-of-the-art microfluidic-based cell quantitation methods with inventive method.

| | Portability (Size, weight) | Throughput (Speed) | Battery-powered | Scalability | Requires laser |
|---|---|---|---|---|---|
| Impedance cytometry | Low | Low | No | None | Yes |
| Fluorescence cytometry | Low | Low | No | None | Yes |
| Waveguide | Low | Low | No | None | Yes |
| CMOS/Digital microfluidics | Medium | Low | No | Some | No |
| Current magnetic bead approaches | Medium | Low | No | Some | Some |
| Inventive microfluidic solenoid | High | High | Yes | High | No |

Micro/nano technology platforms are used to study and direct biological processes at the cellular and sub-cellular level, and to detect disease with greater sensitivity and specificity. Some of the fundamental aspects of microfluidic devices include fabrication, surface property control, pressure-driven and electrokinetic flow, and functions such as fluid mixing, particle sorting, and molecular separations. The integration of optical and electrical signal transduction methods for biosensing provide extraordinary capabilities for bioanalytical and biomedical applications. Materials for microfluidic fabrication include low surface energy fluoropolymer compositions having multiple cure functional groups, such as photocurable and/or thermal-curable functional groups, such that laminated devices can be fabricated, e.g., Tay et al., Advances in microfluidics in combating infectious diseases, Biotechnol. Adv., vol. 34, pp. 404-421, 2016; Antfolk and Laurel, Continuous flow microfluidic separation and processing of rare cells and bioparticles found in blood. Anal. Chim. Acta, vol. 965, pp. 9-35, 2017; U.S. Pat. No. 8,158,728; U.S. Publication No. 2010/0190654.

MEMS-based cell sorting system uses a novel combination of features to accomplish cell sorting in the microfabricated channels housed in a disposable cartridge. It may include a microfabricated cell sorting valve that is responsive to an applied magnetic field. It may further include an electromagnet that generates a magnetic field to actuate the microfabricated cell sorting valve. The electromagnet may have a design which allows it to create a very localized magnetic field while having adequate thermal properties to operate reliably.

The inventive method and device demonstrates feasibility of solenoids and sensing resolution at micro-scales. Technical capabilities of three dimensional arrays of solenoids serve as a platform for other three dimensional microfluidic devices. The methods and technologies of existing microfluidic channels, which are relatively simplistic, will be changed to a three-dimensional paradigm, in which both horizontal and vertical arrays of microfluidic channels are made on a single device.

Solenoids are applied in a microfluidic scale with magnetic nanobeads, based on Faraday's law of changing magnetic fields in a conductive loop inducing a changing current in the loop. The current and voltage induced in the loop is a short pulse, because the passage of the magnetic nanobead in the coils is for a short duration of time. This concept is expanded to solenoids that have N turns of conductive loops. The following equation for induced voltage in a solenoid is derived from Faraday's Law:

$$V_{emf} = -N\frac{d\phi}{dt} = -N\frac{\partial}{\partial t}\int B \cdot ds = -N\frac{\partial}{\partial t}\int \mu H \cdot ds$$

where, $V_{emf}$ is the induced electromotive force, N is the number of turns, dl is the differential length along the contour of a loop, B is the electric flux density, H is the magnetic field intensity, and ds is the differential surface of the closed contour. The sensing element is due to the magnetic permeability ρ, in the equation.

Figure 12C:
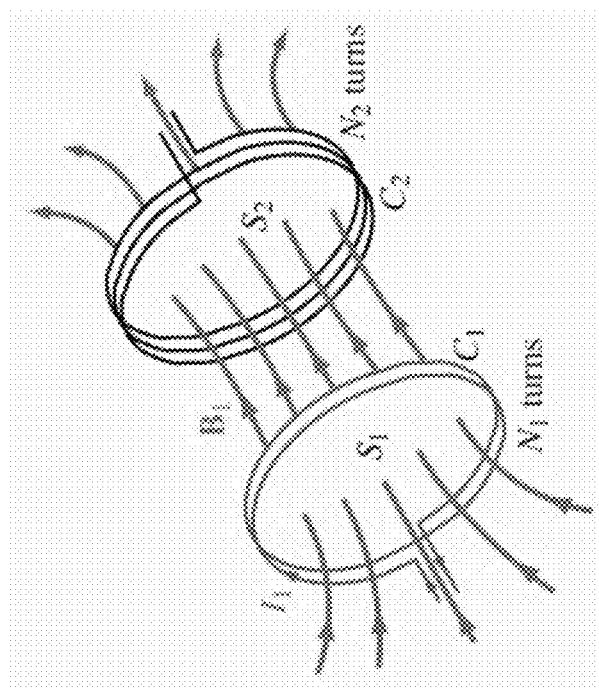
FIG. 12C illustrates a transformer concept with magnetic field through two solenoids.
Figure 12B:
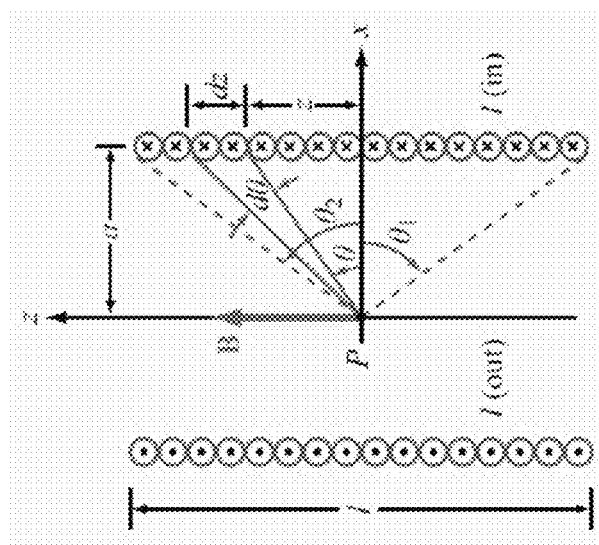
FIG. 12B shows a cross section of the solenoid.
Figure 12A:
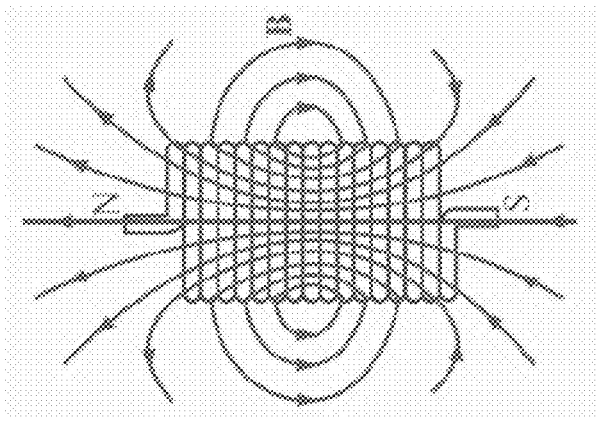
FIG. 12A shows a solenoid.
Figure 13A:
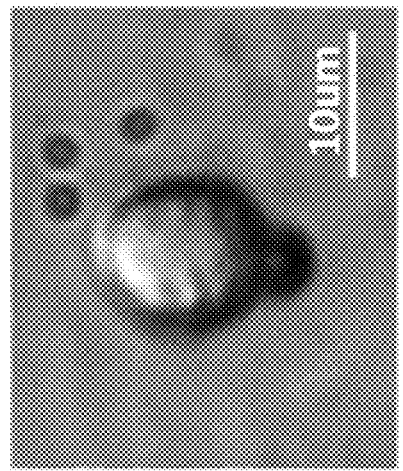
FIG. 13A shows the FIG. 1 target cell magnetized by a magnetic bead combined with a protein with a specific antigen/antibody binding with the target cell.
Figure 13B:
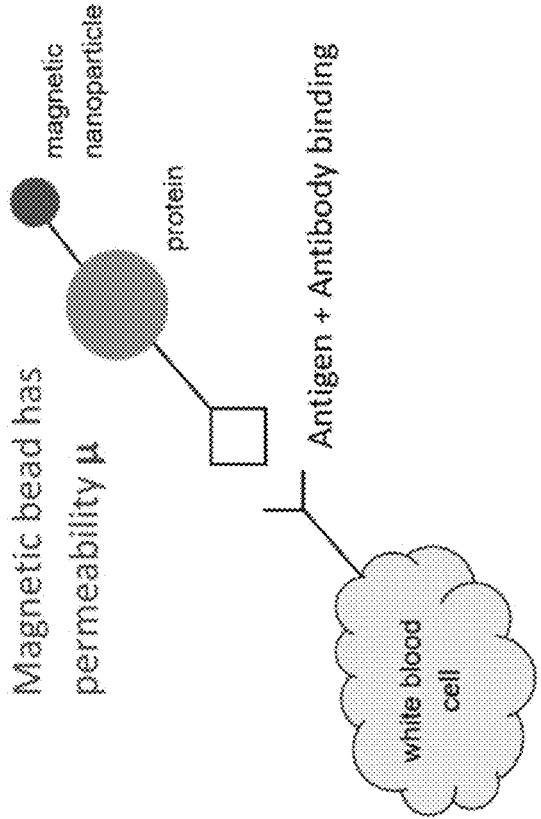
FIG. 13B is a photograph of an antibody-coated magnetic bead bound to RAW 264.7 cells.
Figure 14B:
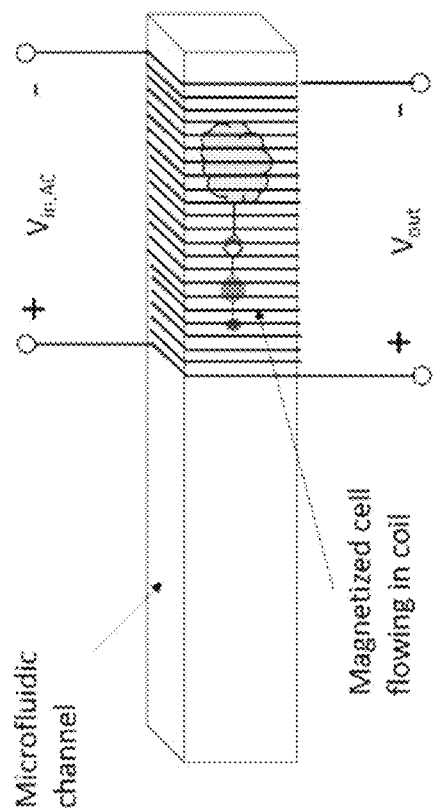
FIG. 14B shows a magnetized cell entering the solenoid.
Figure 14A:
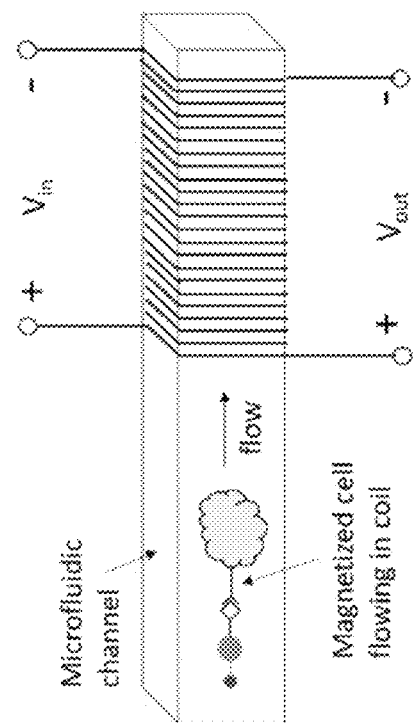
FIG. 14A shows a magnetized cell before entering the solenoid.

FIG. 12A, FIG. 12B, and FIG. 12C show a solenoid made from multiple turns of the circular loop. Magnetic field in a solenoid can be derived by applying the magnetic field H along the axis of a circular loop of radius a, a distance z away from its center. The magnetic flux density in a solenoid is approximately, $$\vec{B} \approx \frac{\hat{z}\mu NI}{l}$$

assuming a long solenoid with l/a>>1, where μ is the magnetic permeability, N is the number of turns, I is current, and l is the length of the solenoid. The length of a solenoid ranges between a few millimeters to centimeters. The diameter or width, depending on whether it is a cylindrical or rectangular solenoid, is slightly larger than the diameter of a magnetized cell, which may be between 30 microns to hundreds of microns. The key part of the equation is the magnetic permeability μ. The presence of the magnetic bead in the solenoid increases the magnetic flux density B by a factor of μ. The relative permeability of magnetic material varies widely, as is known in the art. FIG. 13A shows the magnetization of target cells. Proteins with their unique antigen-antibody binding are combined with a certain magnetic bead with magnetic permeability μ. To count a different type of cell, the protein that has the antigen-antibody binding for that new cell is combined with a magnetic nanobead. FIG. 13B is a photograph of antibody-coated magnetic beads bound to RAW 264.7 cells. For different cell types, any type of magnetic bead can be used as long as the correct protein with the compatible antigen is used. Selectivity of target cells is achieved through the different proteins that have the unique antigen-antibody binding characteristics. FIG. 14A shows a magnetized cell before entering the solenoid, and FIG. 14B shows a magnetized cell entering the solenoid.

The width and height of the opening of the microfluidic channel is approximately 50 μm based on the cell+bead size ranging from about 15 μm to about 25 μm. Assuming a length of 10 mm and a current of 1 A, the magnetic flux density in a single loop of coil is:

$$\vec{B} \approx \frac{\hat{z}\mu NI}{l} = \frac{4\pi \times 10^{-7} \times 1A}{0.01 \text{ m}} = 4\pi \times 10^{-5} \frac{Wb}{m^2}$$

$$\Phi = B \cdot A = 4\pi \times 10^{-5} \times (50 \times 10^{-6})^2 = \pi \times 10^{-13} Wb$$

Assuming the relative magnetic permeability is 101, and the time it takes to pass through the coil is 10 milliseconds, the change in the flux per time is:

$$\frac{\partial \Phi}{\partial t} = \frac{(\mu_r - 1) \times \Phi}{0.01 \text{ sec}} = \frac{(101-1) \times \pi \times 10^{-13} Wb}{0.01 \text{ sec}} = \pi \times 10^{-9} \text{ Wb/sec}$$

Assuming the solenoid has 20 turns of coils, $$|V_{emf}| = \left|-N\frac{\partial \Phi}{\partial t}\right| = 20 \times \pi \times 10^{-9} = 20\pi \text{ } nV$$

Figure 11:
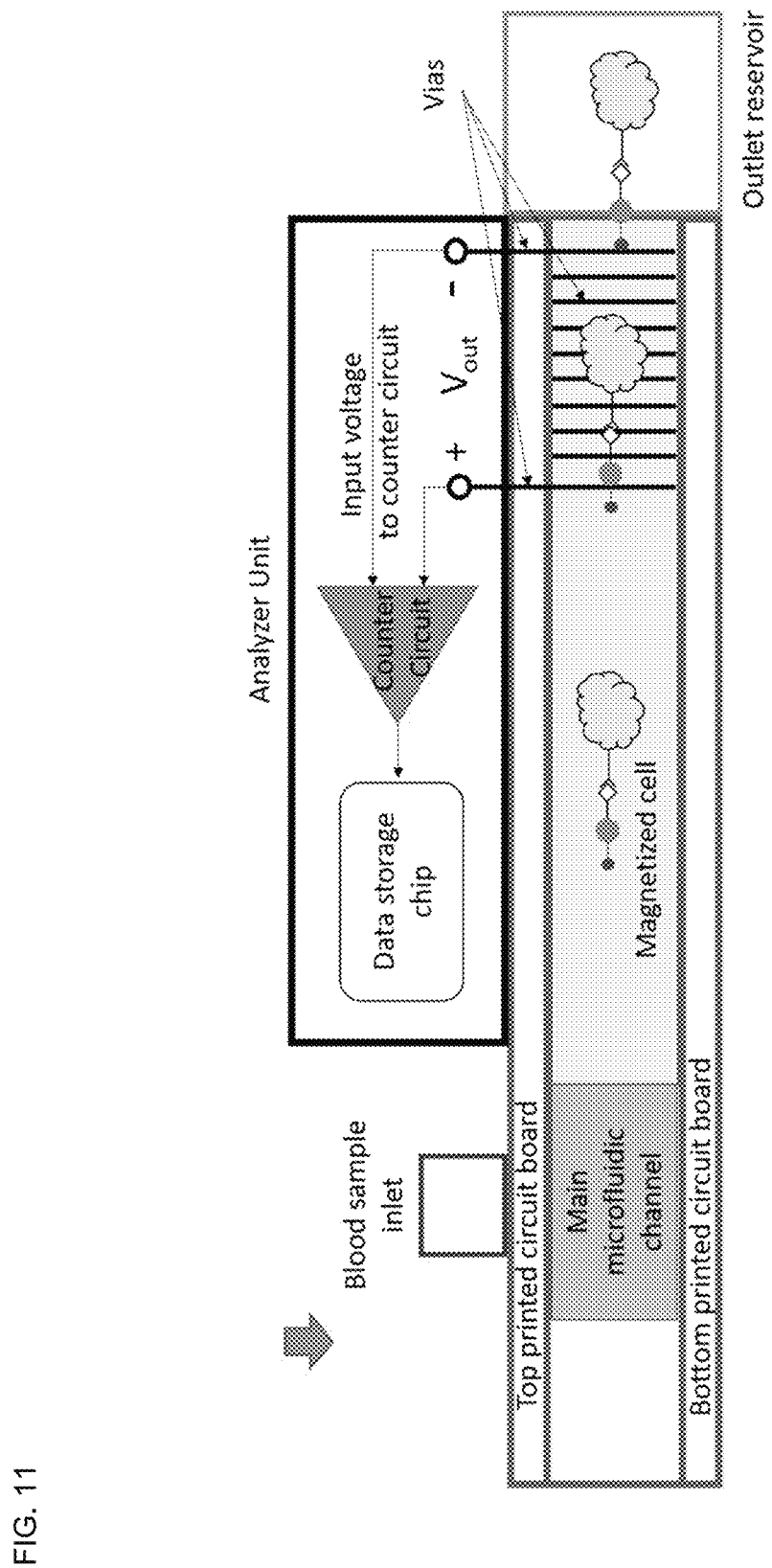
FIG. 11 shows the cross-sectional view of the microfluidic solenoid array-based device integrated with the analyzer unit and vias.
Figure 16:
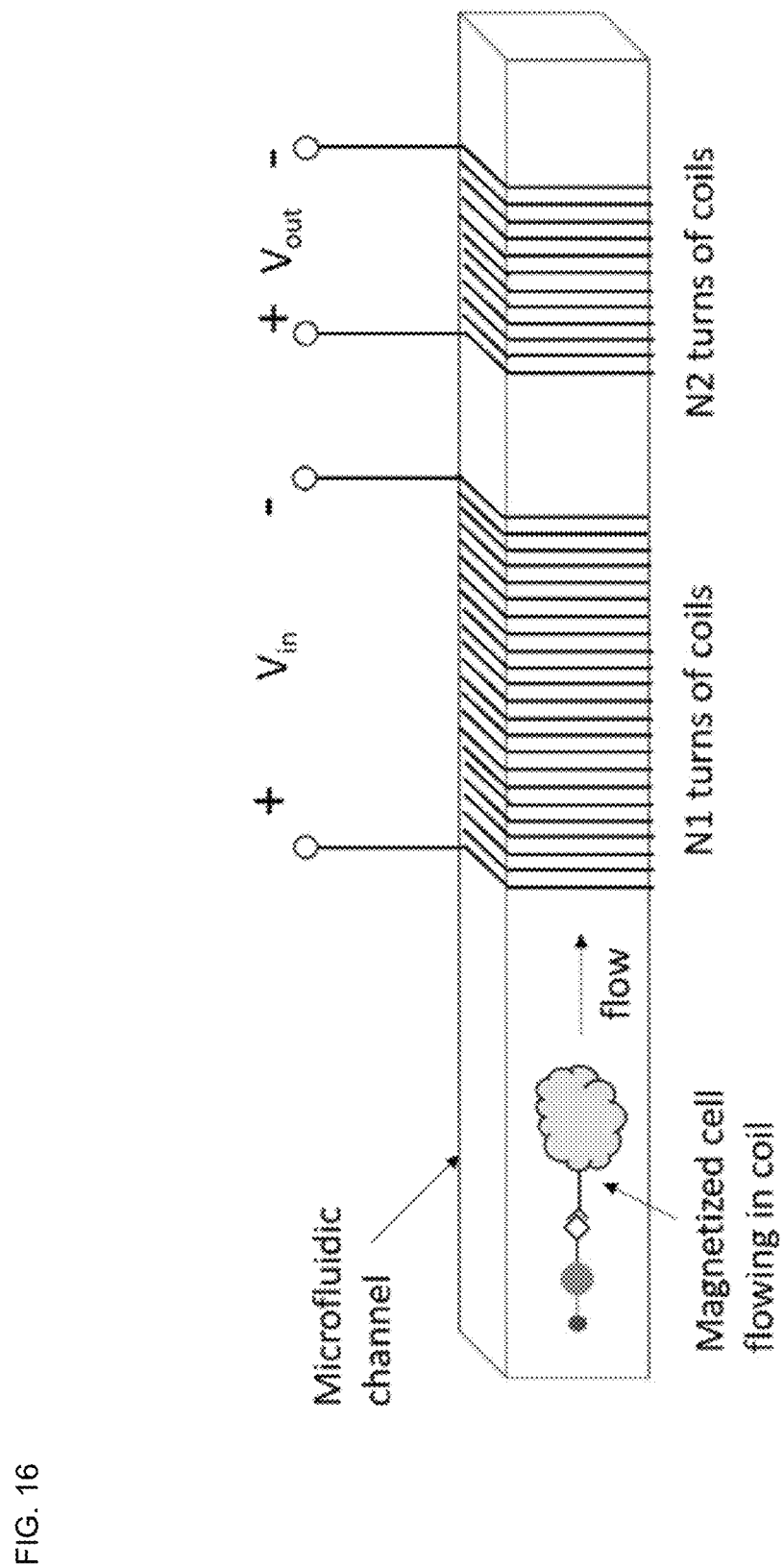
FIG. 16 shows a microfluidic transformer using two solenoids of different turns of coils.

With a range of nanovolts induced, a transformer can be used to step up the voltage, and an operational amplifier can be used to amplify the signal magnitude to measure the signal using multimeters. An illustration of the operational amplifier is shown in FIG. 11. An external transformer after the voltage signal is induced can be used, or a solenoid can be embedded into the microfluidic channel as shown in FIG. 16. Alternatively, a nanovoltmeter can be used to measure small voltage signals down to nanovolts and currents down to pico-amperes. Potentiometers can be used to create current, which can also be measured using a nanovoltmeter.

Figure 10:
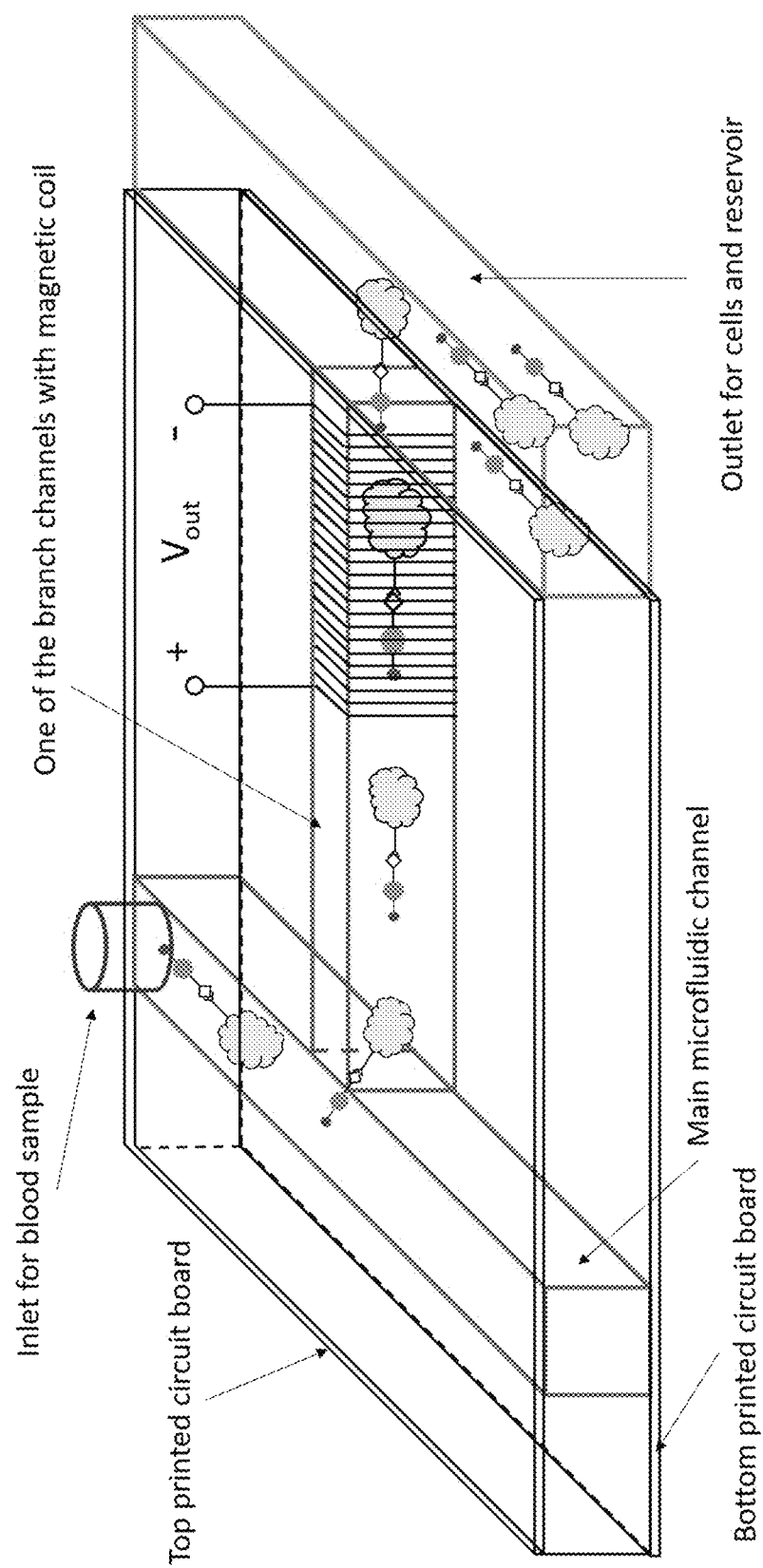
FIG. 10 shows an overview of the microfluidic solenoid array-based device.

FIG. 10 is an overview of a microfluidic solenoid array based cell counter system. FIG. 11 is a cross sectional view of a microfluidic solenoid array-based cell counter system.

In the microfluidic solenoid, a DC or AC source is connected to the terminal across the solenoid and the output is connected to this same terminal. If a DC source is connected, the magnetized cell induces a surge or current and voltage across the output terminal. If an AC source is connected, the output will be a change in the sinusoidal AC current and voltage. The advantage of the DC source is that a battery can be used as the power source, greatly simplifying the system and increasing device portability.

FIGS. 10 and 11 show the overall system of the lab-on-a-chip, and show both the inlet for the cell samples and the outlet which leads to a reservoir. Although only a single channel is shown, there can be several horizontal channels for parallel processing, and vertically stacked channels to create a three dimensional structure for even higher throughput. The cross-sectional view illustrates how the signal generated across the solenoid is picked up by a comparator that uses an operational amplifier to compute each magnetized cell that passes through the solenoid. The lab-on-a-chip has comparing and counting computation components. The lab-on-a-chip can, but does not necessarily have to, communicate with another computing device, assuming the microcontroller that stores the cell count into its memory is on the same chip. If the microcontroller that stores the cell count into its memory is not on the same chip, then the lab-on-a-chip can communicate with a microcontroller to store the cell count data.

Application of Faraday's law to biosensors where cells are magnetized and passed through a microfluidic solenoid is a completely new and unexplored concept. To enable the inventive sensing mechanism, new fabrication processes to create solenoids wrapped around microfluidic channels use photolithography and etching, typical in microfluidic fabrication. By designing masks, certain parts of the device are exposed to ultraviolet light while certain parts of the device are not exposed to ultraviolet light. Positive or negative photoresist is used to etch away the part of the device that is exposed to ultraviolet light. Development of a three dimensional microfluidic "digital" computer that can perform parallel cell processing and analyze the electrical signals from each microfluidic channel through an electrical circuit interface is another inventive embodiment. The comparator circuit takes in an analog signal and the output is a "1" or "0", which is the input to a microcontroller that stores the 1's in data memory.

In use, the user of the device mixes a sample of blood to be analyzed with a sample of magnetized protein to create the antigen-antibody binding that magnetizes the target cell to be counted. The user then must input the now-mixed blood sample into the device and counting is initiated. A display may indicate the status of the quantitation process and the current cell count. Upon completion of the process, the blood sample remain in a reservoir until disposal.

A first step simulates the change in magnetic field in the solenoid due to the magnetized cell, and optimizes the microfluidic solenoid dimensions to attain maximum sensitivity. Magnetic and fluorescent beads are used to compare the cell quantitation of the proposed microfluidic solenoid to the fluorescence cytometry.

Figure 15:
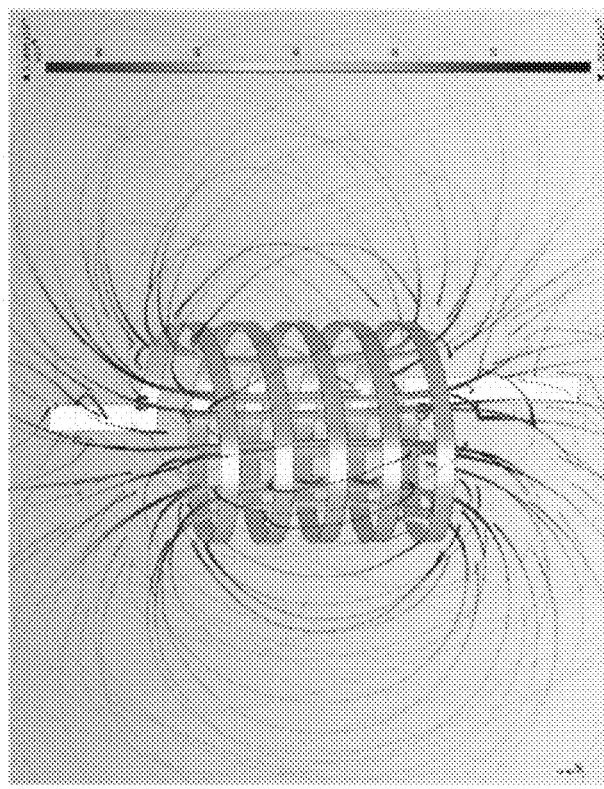
FIG. 15 shows a COMSOL® simulation showing magnetic fields throughout the solenoid.

To maximize detection sensitivity, microfluidic solenoids are designed to simulate various structures or shapes and dimensions, and to determine the strength of the magnetic field in the solenoid. Using software such as COMSOL® Multiphysics software, various solenoids such as cylindrical shell, rectangular shell, or square shell solenoids are drawn as three dimensional models. Coils are wrapped around or inserted in grooves on the solenoid surface, or vias are drawn that penetrate the solenoid shells and connect with the top and bottom conductive traces to create a closed loop. Using Multiphysics software, one can simulate magnetized cells in a blood sample that moves at a velocity through the solenoid and obtain a graph of the voltage versus time as the magnetized cell passes through the solenoid. The number of turns, the velocity of the magnetic bead, the thickness of the shell, the length of the solenoid, and other parameters can be parametrically studied to determine the optimal dimensions of the solenoid that maximize detection sensitivity. Multiphysics software such as COMSOL® tracks velocities of a traveling magnetic bead through different radii of solenoids to maximize the induced current in the coils. Parametric studies of factors such as radii of vias, proximity of coils to the bead, number of turns, velocity of cell will optimize sensitivity of the design. The simulation also provides an approximate range for the magnitude of the induced electrical signals; based on this information, transformers with N1:N2 ratio of coils can be used to increase either the voltage or current or use amplifiers to amplify the magnitude of the signal. FIG. 15 shows a COMSOL® simulation showing magnetic fields throughout the solenoid.

Vertical vias are one way to create a solenoid, and creating grooves in the outside surface of the solenoid is another way to create a closed loop around the solenoid. Alternatively, one can simply wrap a wire around a cylindrical, square, or rectangular solenoid. A transformer design using two solenoids of different number of turns of coil solves a potential problem where the magnitude of the induced electrical signal is too low. MEMS fabrication processes create vertically stacked microfluidic solenoids for high throughput based on three dimensional solenoid arrays.

Three dimensional, multi-layer microfluidics and microfluidic solenoids have been developed. However, the solenoids that have been developed are on top a substrate and not wrapped around a microfluidic channel, which requires sophisticated steps using vias through PDMS or other material in which the channels are made. Vias in microfluidic devices that have been reported include non-conductive vias through which liquid can travel between multiple layers.

Figure 19:
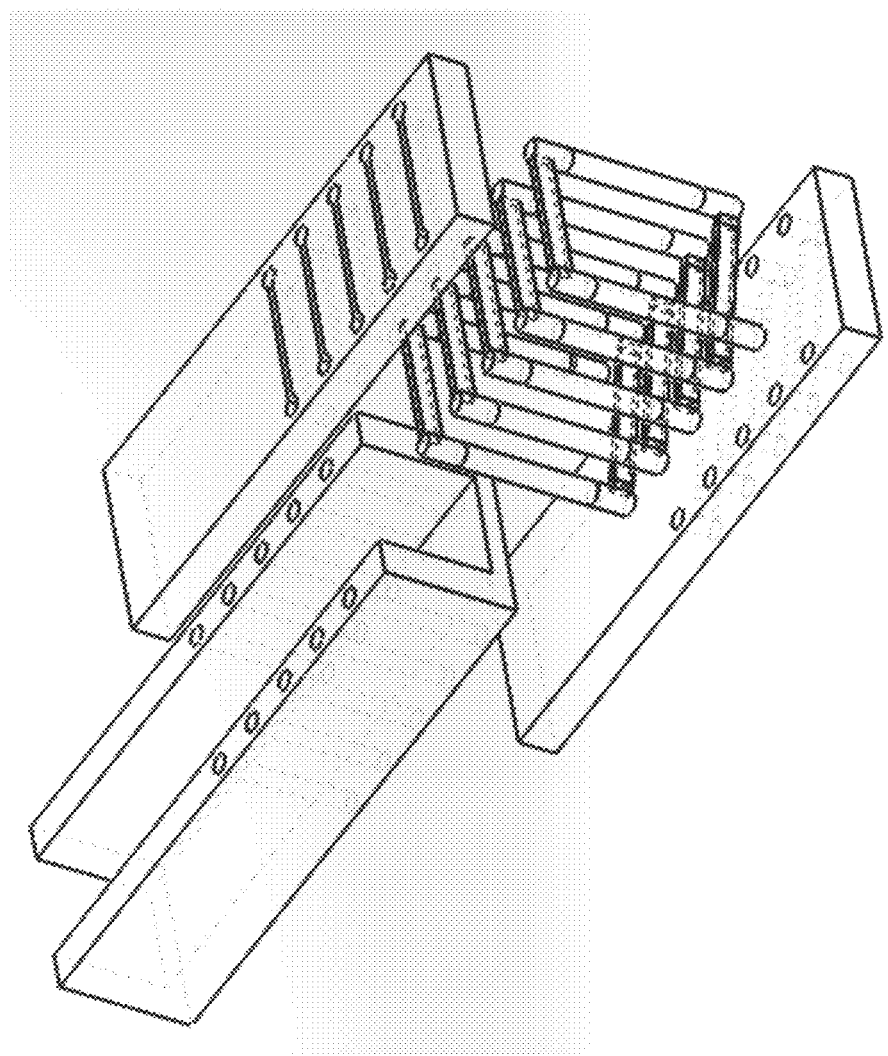
FIG. 19 is a computer aided design (CAD) drawing of microfluidic channels with vertical vias connected to the top and bottom conductive traces to create closed loops with the top portion in expanded view; a printed circuit board (PCB) on top and a PCB on bottom is connected together through the vertical vias which also pass through the polydimethylsiloxame (PDMS) microfluidic channel.
Figure 19:
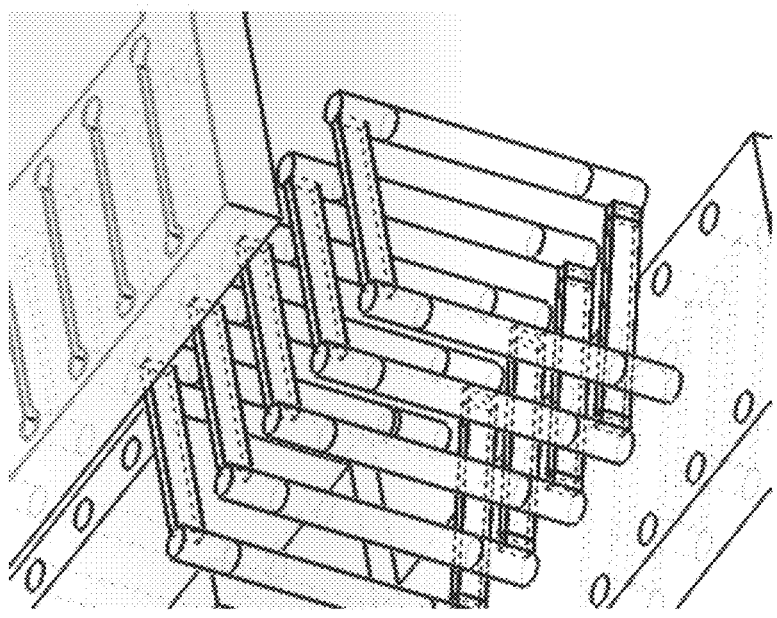

In the inventive method, multiple vias aligned carefully with the top and bottom conductors are created either mechanically using wire bonds or by photolithography. FIG. 19 shows a computer aided design (CAD) drawing of microfluidic channel with vertical vias connected to the top and bottom conductive traces to create closed loops. A printed circuit board (PCB) on top and a PCB on bottom is connected together through the vertical vias which also pass through the polydimethylsiloxame (PDMS) microfluidic channel. Photolithography may advantageously be mass produced with accurate dimensions of vias that are in the range of tens of microns. Photolithography requires steps that include spin on photoresist, UV light through mask, etching, and growing metal to make vias.

Transformers are developed by using two solenoids with different number of turns of coils that are in close proximity to each other. Transformers can increase the voltage or current on the solenoid at which the output is measured, depending on whether the number of turns is greater or less than the primary solenoid. If the voltage or current is too small to detect using standard multimeters, the transformer can boost the voltage or current signal by the ratio of the turns. Microfluidic transformers are not yet used, and there are numerous applications for their use, including boosting electrical signals to any target level. FIG. 16 shows a microfluidic transformer using two solenoids of different turns of coils.

Figure 17:
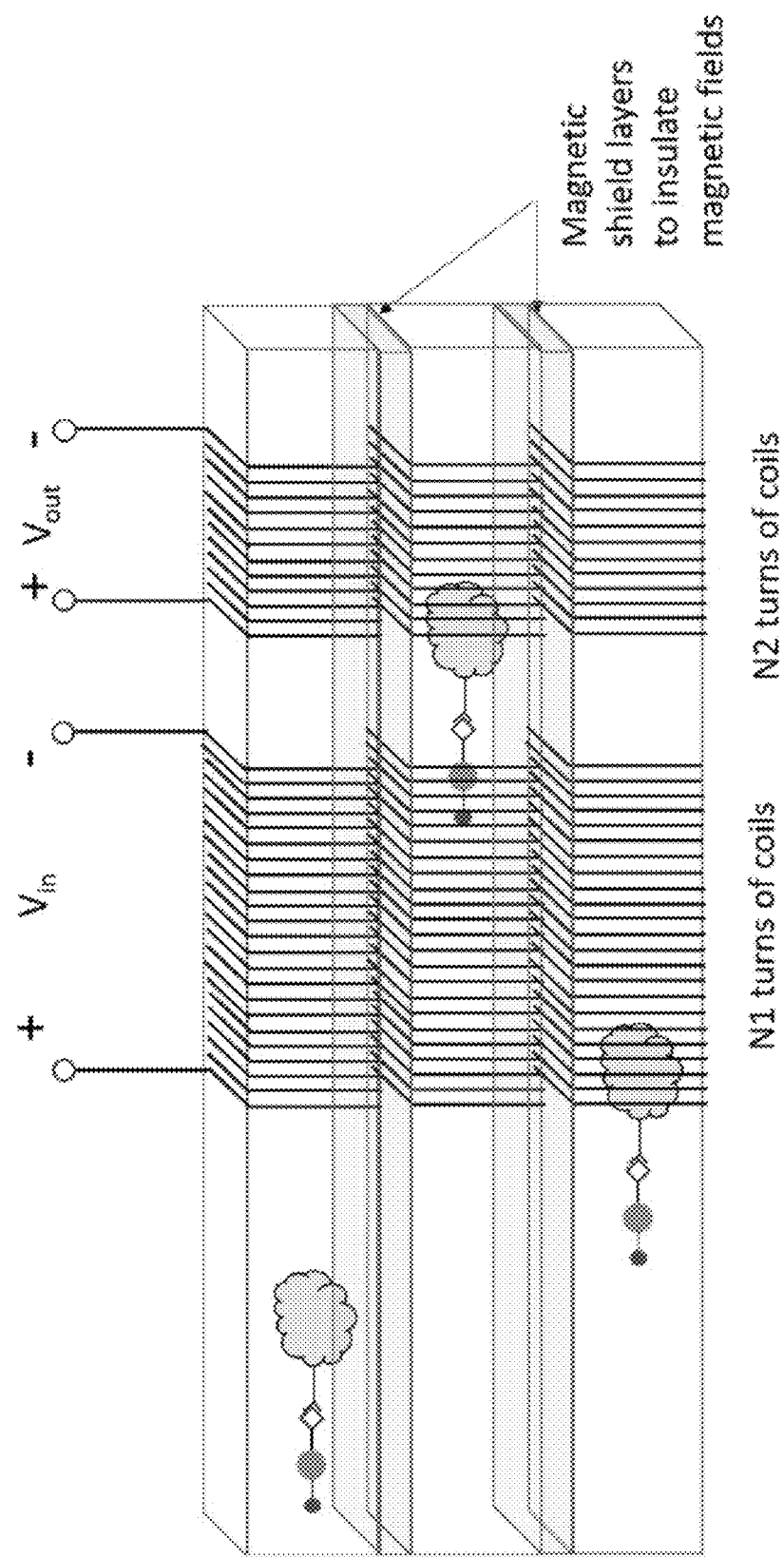
FIG. 17 shows vertically stacked solenoids with insulating layers to create a scalable microfluidic three dimensional array system for high throughput.
Figure 20:
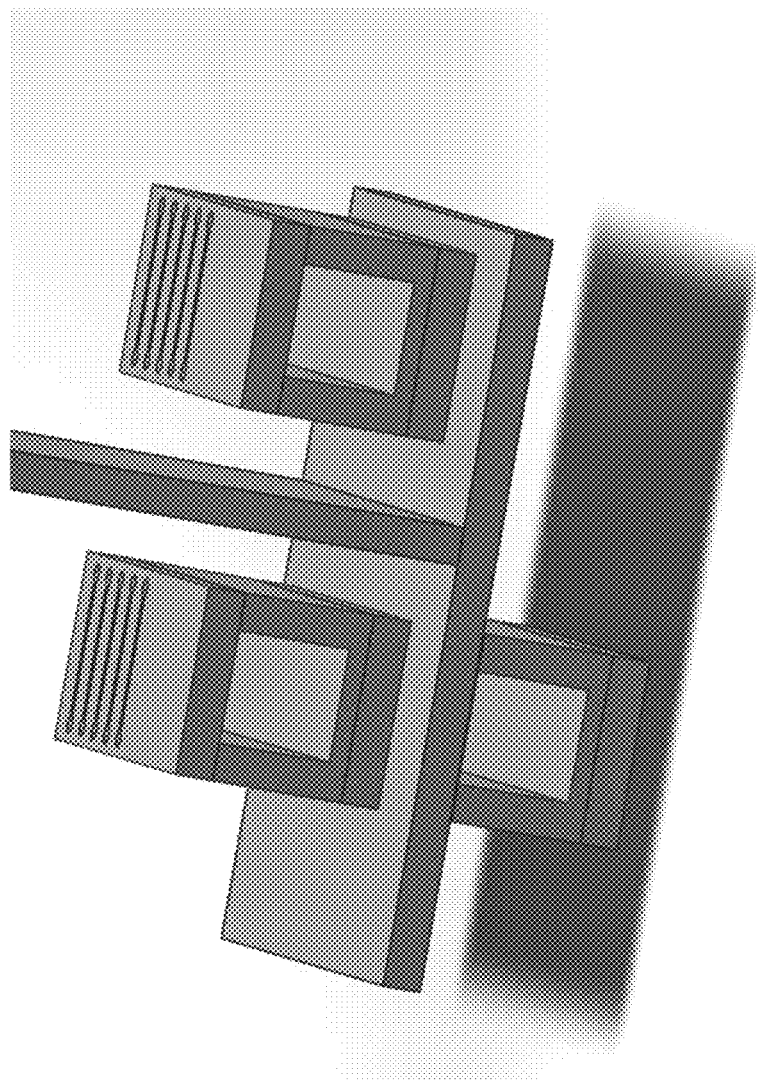
FIG. 20 is a CAD drawing of vertical and horizontal arrays of microfluidic solenoids with insulating layers between the channels to prevent magnetic coupling.
Figure 20:
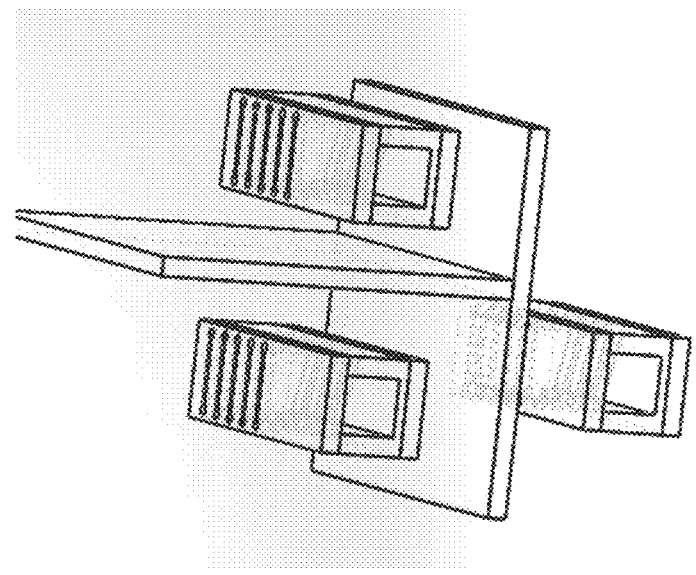
Figure 21:
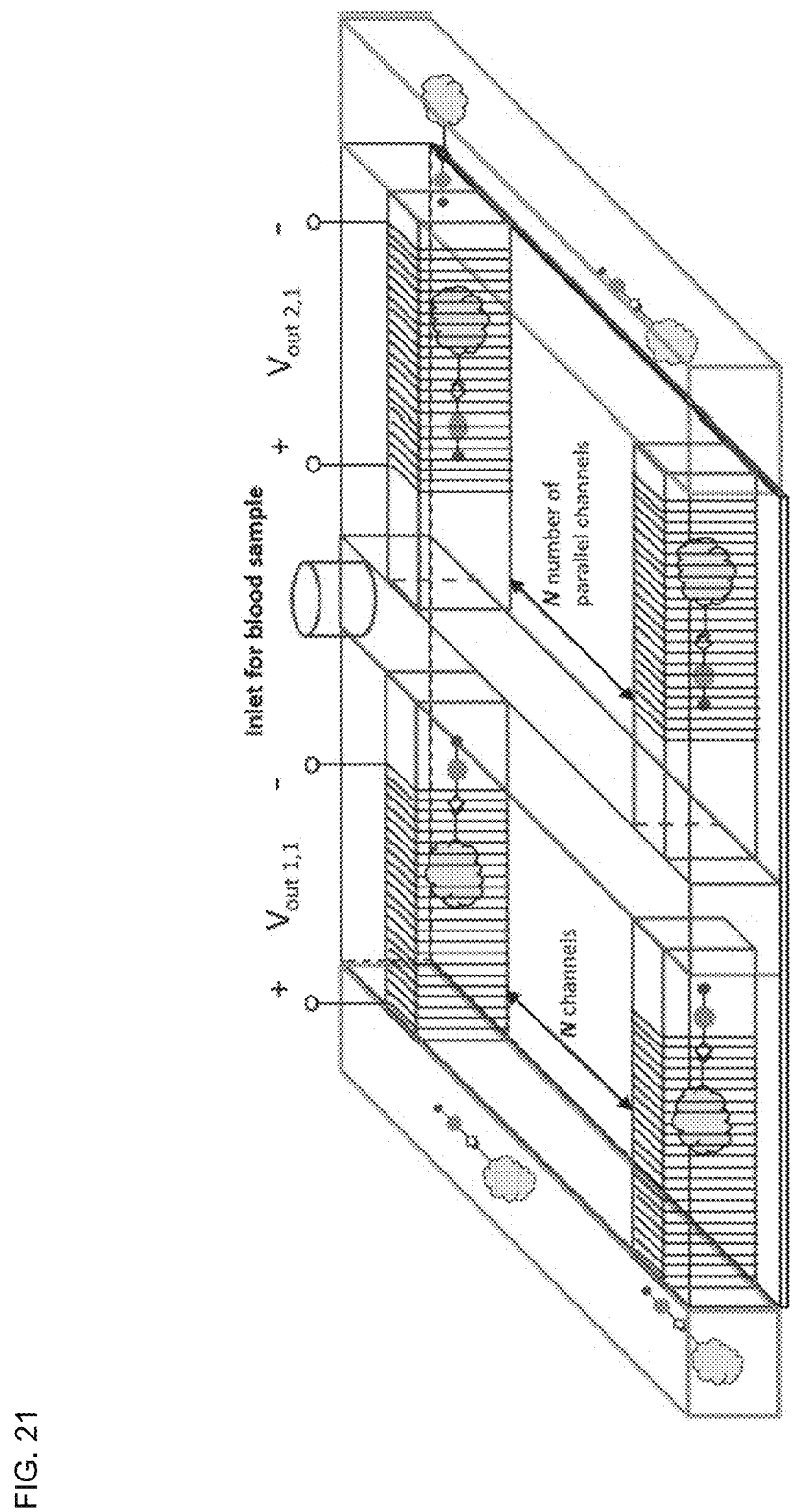
FIG. 21 shows a horizontal two dimensional array of microfluidic channels for parallel cell processing to increase throughput.
Figure 22:
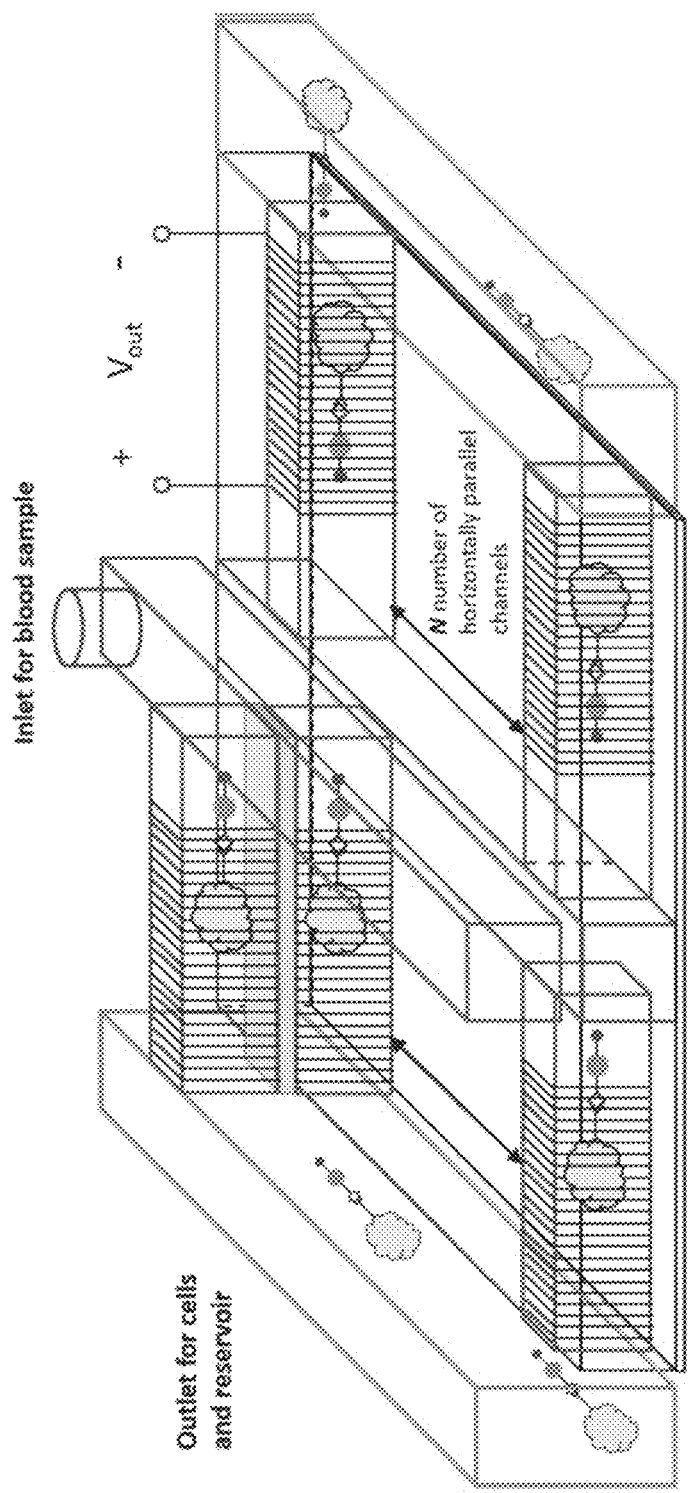
FIG. 22 shows a three dimensional array of both horizontal and vertical arrays of microfluidic channels for increased throughput.
Figure 23:
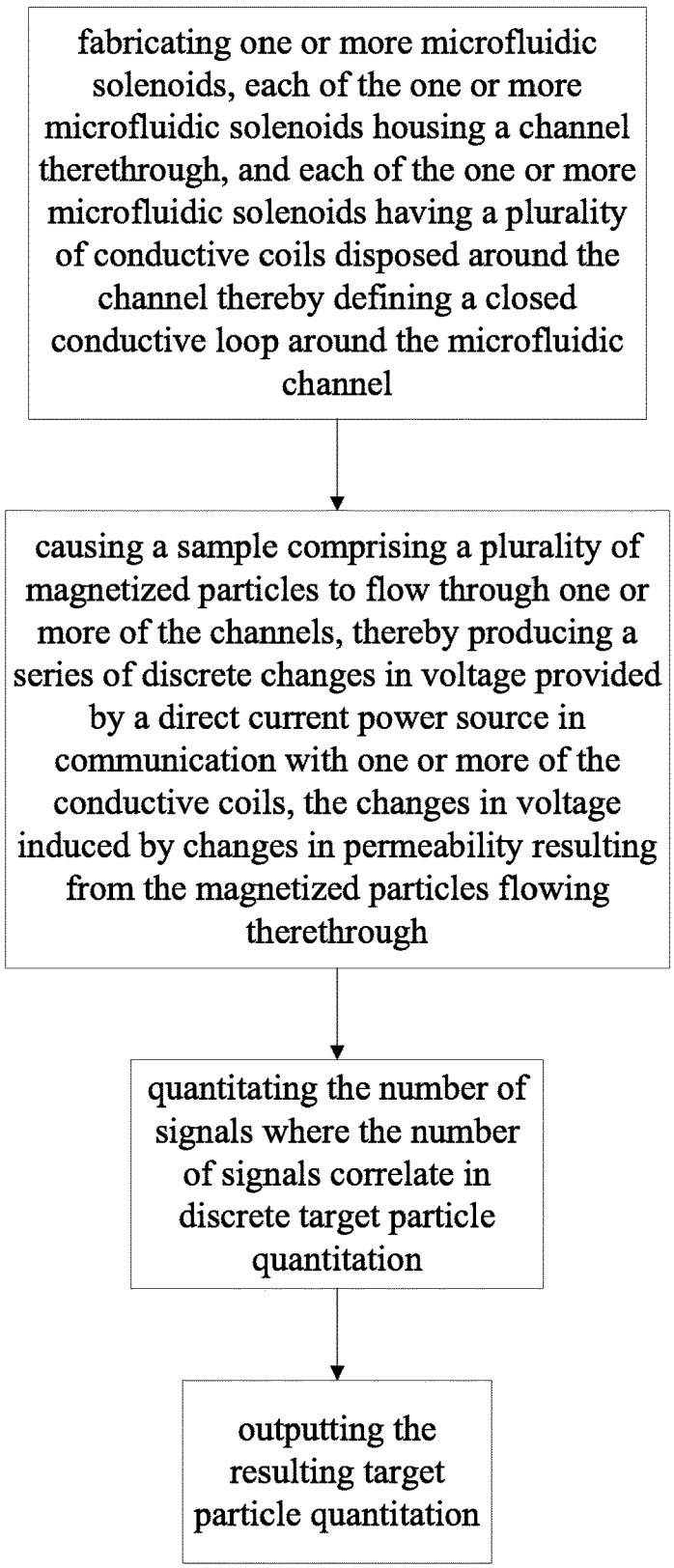
FIG. 23 shows a flow diagram in accordance with the present disclosure.
Figure 24:
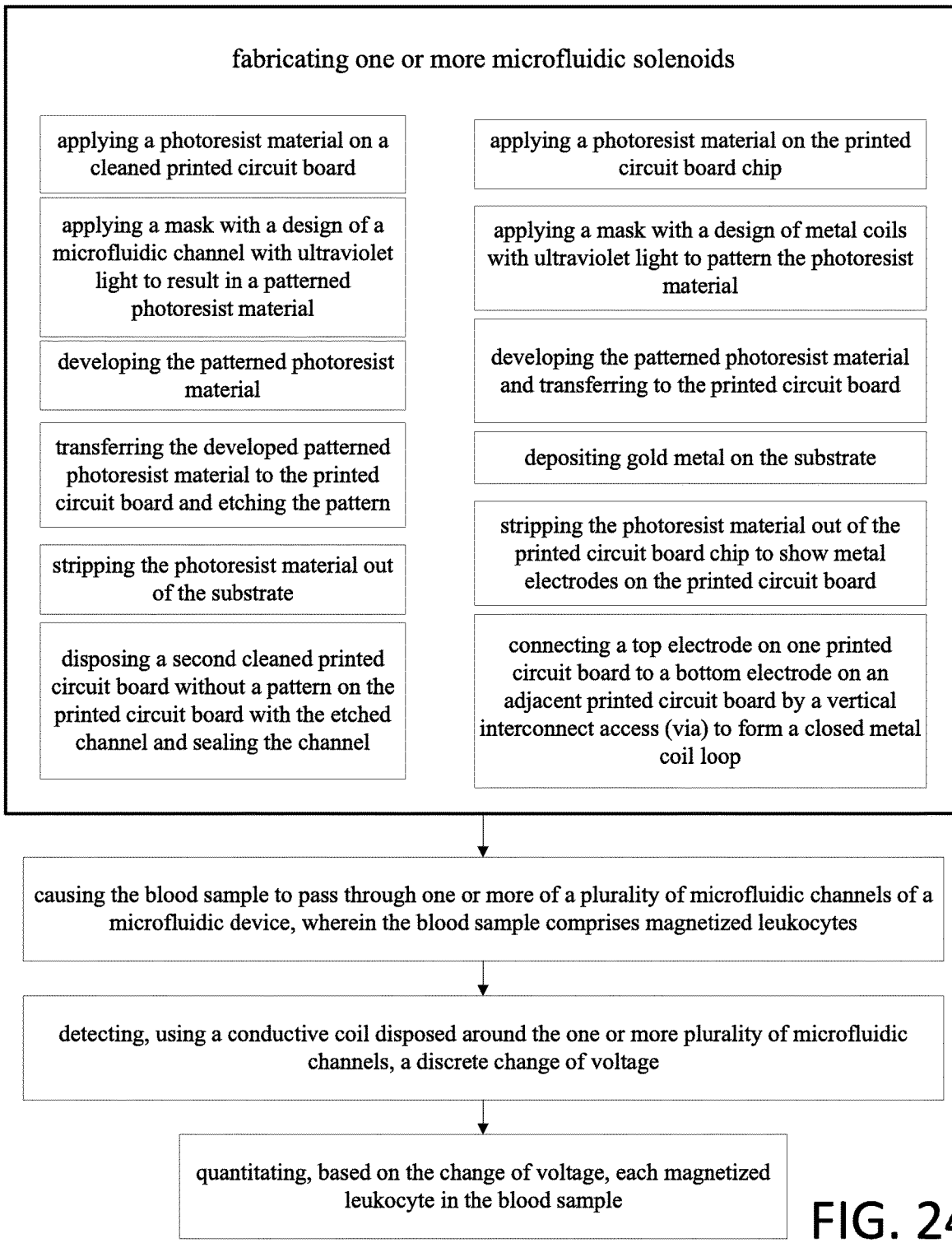
FIG. 24 shows a flow diagram in accordance with the present disclosure.

Multi-layer microfluidic devices use channels to allow fluid flow through multiple layers. Vertically stacked solenoid channels can have magnetic shielding between channels to prevent field coupling between solenoids. Each vertical channel allows cells to flow through them, and enables parallel processing of cell counting. This is analogous to a three dimensional microfluidic "digital" biocomputer that can process cells with high throughput, shown in FIGS. 17 and 20.

The velocity of the magnetic bead through the solenoid affects the magnitude of the induced current in the coils. The comparative magnitude of the induced signal, based on velocity due to gravity compared to a vacuum pump, models fluid dynamics of the microfluidic channels. A parametric comparison of various pumping forces serves as a reference to determine the signal-to-noise threshold level required to minimize false negatives. A gravity-based system requires tapered channel designs to induce fast throughput down the solenoid in the microfluidic channel. The edge friction is likely to set a physical limit on the flow rate within the channel, which can be used to determine how many coils the solenoid requires to detect a single cell at a specific flow rate.

Figure 18:
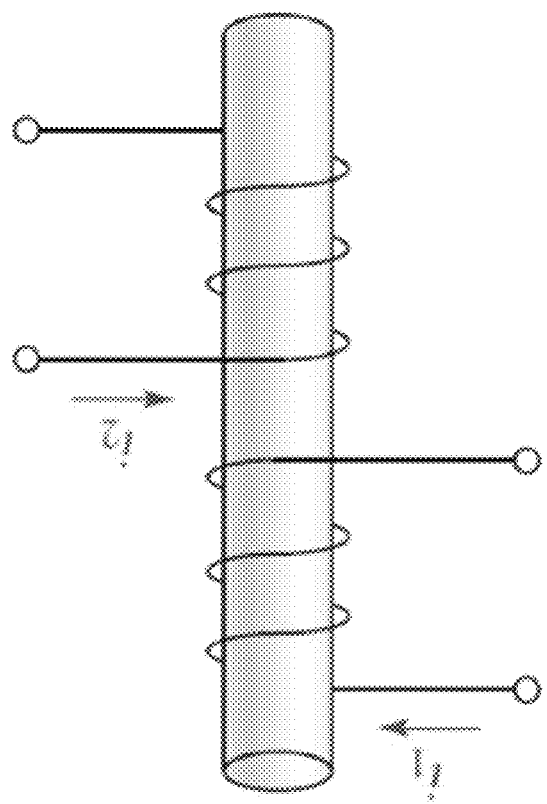
FIG. 18 shows a cylindrical solenoid with coil wrapped manually without the need for vias.

Conductive vias that align with and bond to the conductive traces on the top and bottom of the PDMS are used in one embodiment. Cylindrical solenoids with thin wire wrapped around a cylindrical tube, shown in FIG. 18, are used in an alternative embodiment. This alternative embodiment bypasses the need for creating vias and ensures that a microfluidic solenoid can be fabricated.

Comparisons with fluorescence cytometry validate the inventive methods. In the inventive method, a target cell is magnetized using proteins combined with a magnetic bead, and the magnetized cells are quantitated by the inventive device. For the comparison, the same test cells are fluorescently labeled. Using an BD Acurri flow cytometer, and a Sony Biosciences SH800 cell sorter, accuracy of the methods and devices are compared.

To ensure an unbiased comparison, the cell preparation step is important. For example, if multiple magnetic beads bind to a single cell, or no magnetic beads bind to a single cell, the induced electrical single will have a much higher magnitude and a single cell can be interpreted as multiple cells. To prevent such false positives, thresholds of electrical signal levels can be used to determine how many magnetic beads are bound to a single cell.

Although inducing current due to change in magnetic field caused by a change in magnetic permeability in the solenoid is based on sound physics, the signal-to-noise ratio of the output signal may be lower than that detected by standard multimers. In this case, transformers after the signal is outputted may boost the voltage or current level. Operational amplifiers and low-noise-amplifiers can be used to suppress the noise level while amplifying the signal. Highly sensitive nanovoltmeters can measure voltages in the nanovolt range and current in the pico-ampere range. A vacuum pump may control the velocity of the magnetized bead through the solenoid to control the magnitude of the signal.

The inventive device, essentially a lab-on-a-chip as previously referenced using a micro printed circuit board with microfluidic channels, detects magnetized nanoparticles that in turn can be inserted into another device having analysis software. The test chip is a cartridge to collect, label, and transport a sample through microchannels. The cartridge is situated in an analyzer that performs all detections and data analysis.

In one embodiment, the device quantitates total leukocytes. In one embodiment, the device quantitates leukocytes general types, i.e., granulocytes and mononuclear cells. In one embodiment, the device quantitates granulocyte types, i.e., neutrophils, eosinophils, and basophils, and mononuclear types, i.e., lymphocytes and monocytes, providing the information one would receive about leukocytes on a differential blood count. The inventive device quantitates the specific cells that have been labeled by nanoparticles. Differentiation of different cell types is performed using different antibodies with executed nanoparticles.

Referring to FIG. 1, cells containing a protein to which leukocytes bind, i.e., target cells that are receptors to leukocytes, are coated with magnetic nanoparticles, or preformed target cells are obtained. Nanoparticles may include, but are not limited to, quantum dots, fullerenes, buckyballs, dendrimers, liposomes, aptamers, micelles, and others as known in the art. As only one non-limiting example, dendrimers include poly(amidoamine) (PAMAM), poly(amidoamine-organosilicon) (PAMAMOS), poly(propyleneimine) (PPIO), tecto, multilingual, chiral, hybrid, amphiphilic, micellar, multiple antipen peptide, and Frechet-type dendrimers.

In either case, the magnetic-coated cells are then mixed with a to-be-analyzed sample of patient's blood, obtained through a venipuncture, fingerstick, etc. containing leukocytes, and the cellular protein binds to the leukocytes, forming magnetized leukocytes or magnetized WBC. As the blood sample is mixed with the magnetically coated protein, the protein attaches to the leukocytes. Exemplary antigen/antibody pairs are known in the art. As only one non-limiting example, biotin/streptavidin may be used.

Figure 2:
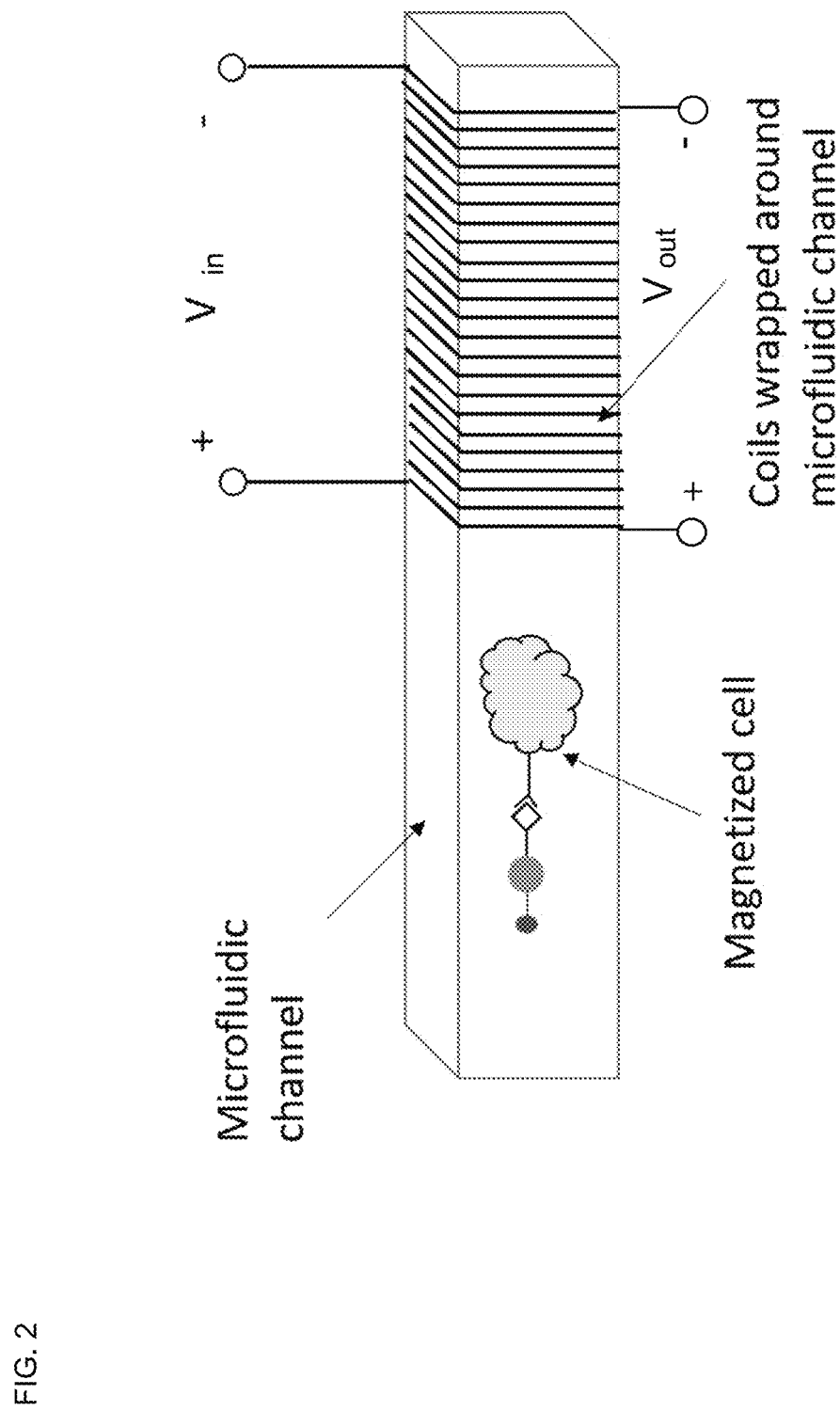
FIG. 2 shows a magnetized cell before entering the solenoid of a microfluidic channel.
Figure 3:
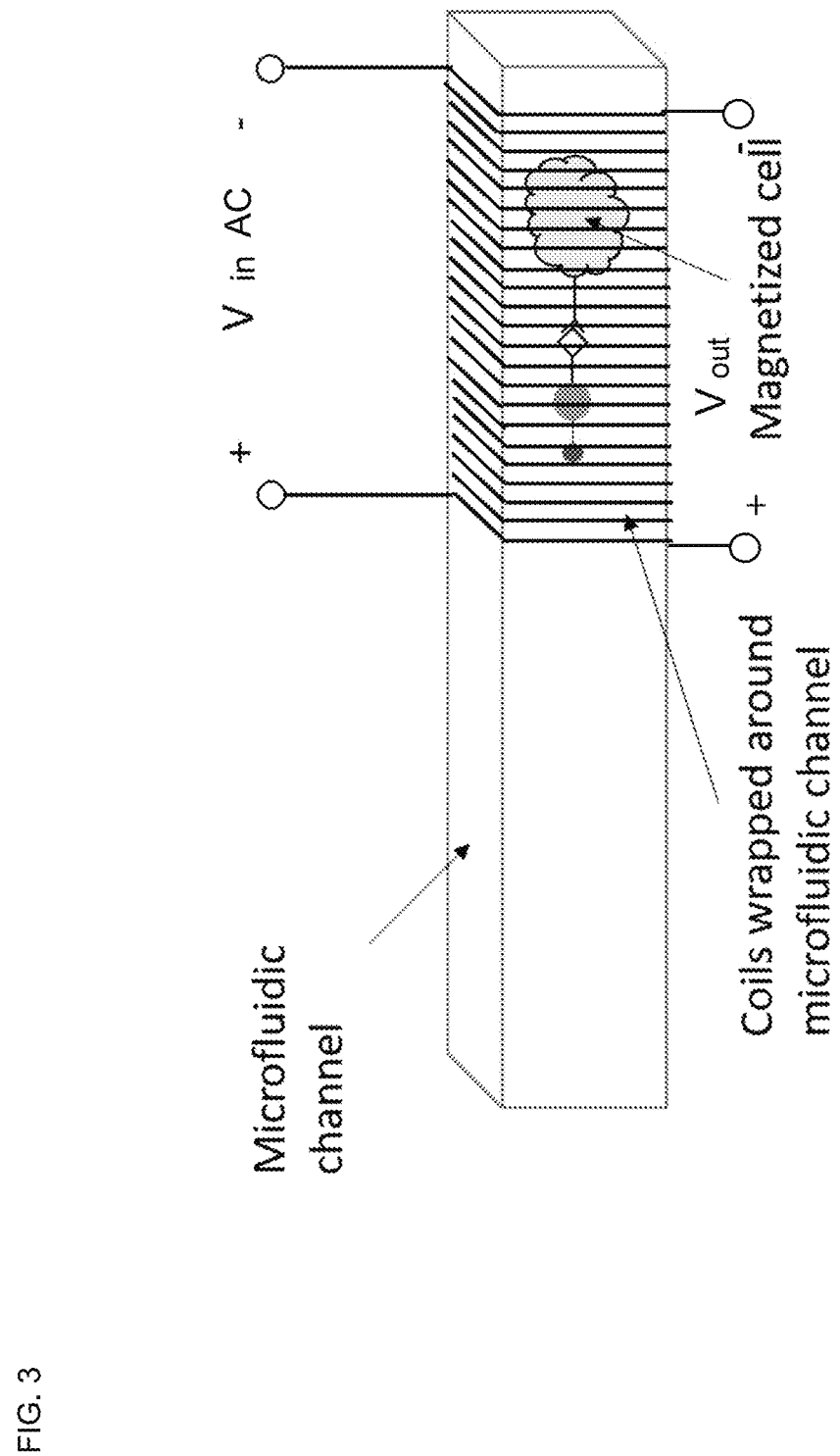
FIG. 3 shows the magnetized cell in FIG. 2 entering the solenoid.
Figure 4:
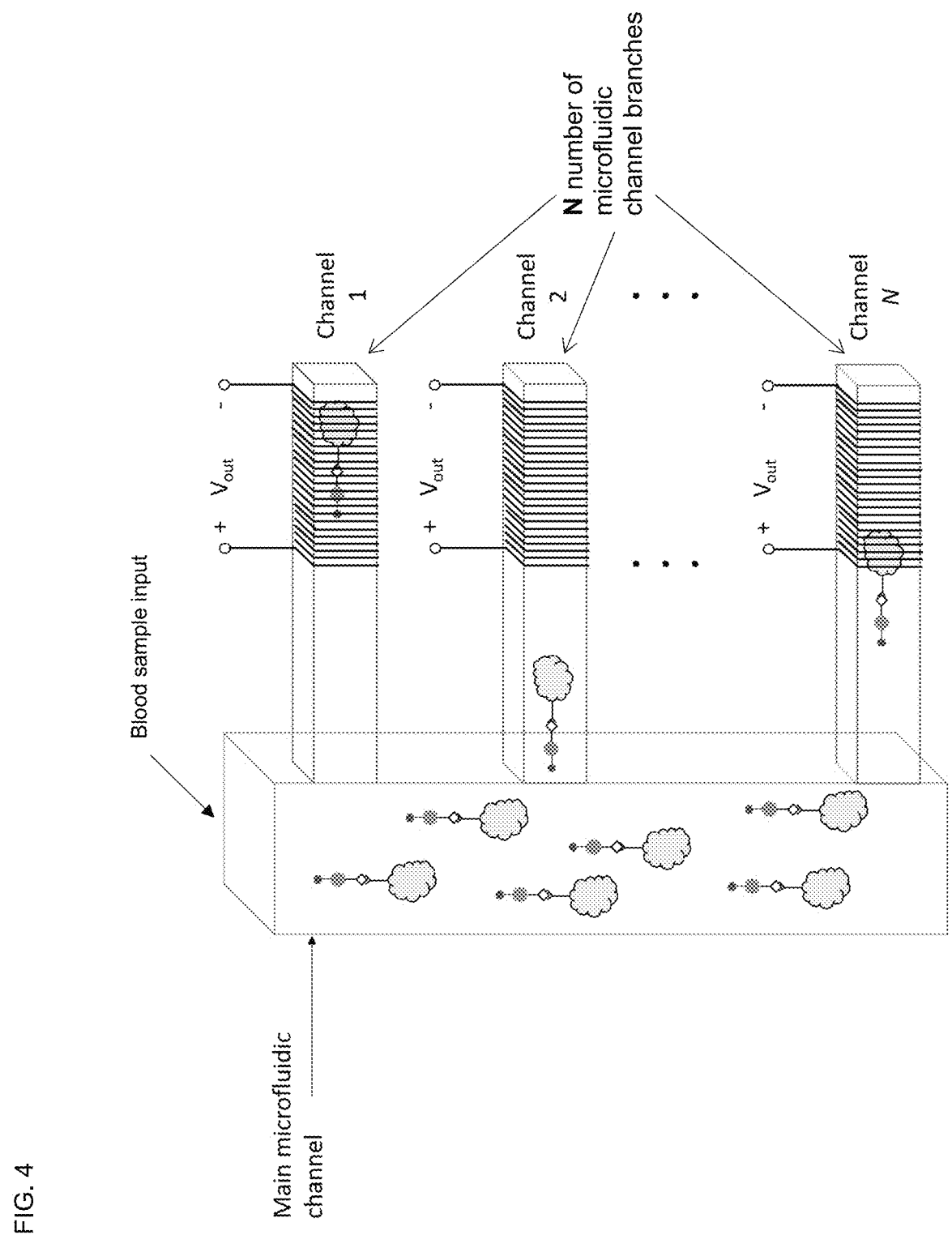
FIG. 4 is a schematic overview of the microfluidic system with number of microfluidic channels N.

The magnetized leukocytes flow through the microfluidic device and the different channels, as shown schematically in FIGS. 2-4. The channels are designed through a new processing/fabrication technique, discussed more fully below, which can create coils around the microfluidic channels, as shown in FIGS. 2-4. As shown in FIG. 4, adjacent to one channel may be another channel with a gap between the channels. This second channel also has coils wrapped around it. The new fabrication technique creates electrical coils (also called loops) around the microfluidic channels. One channel allows all the cells found in whole blood to flow through. The number of channels N as shown in FIG. 4 enable parallel processing which speeds up the quantitation process.

Figure 5:
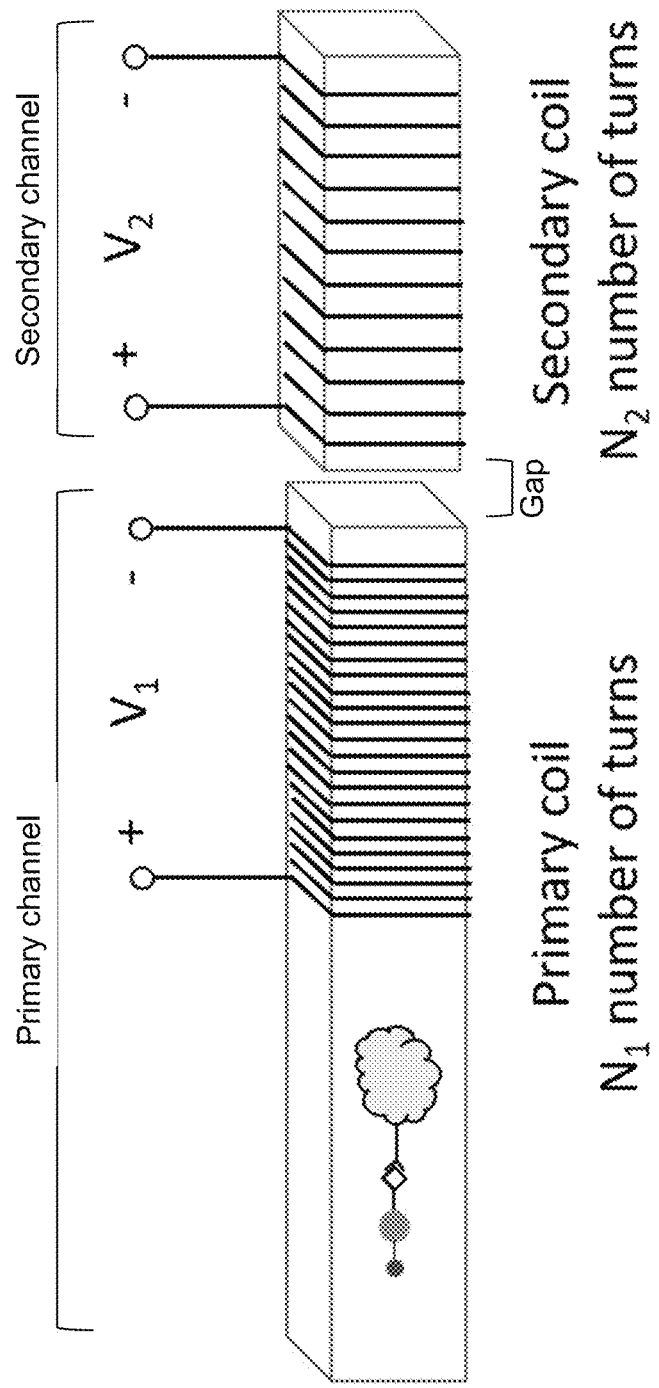
FIG. 5 shows a transformer microfluidic channel where the cell has not entered the primary coil or loop.
Figure 6:
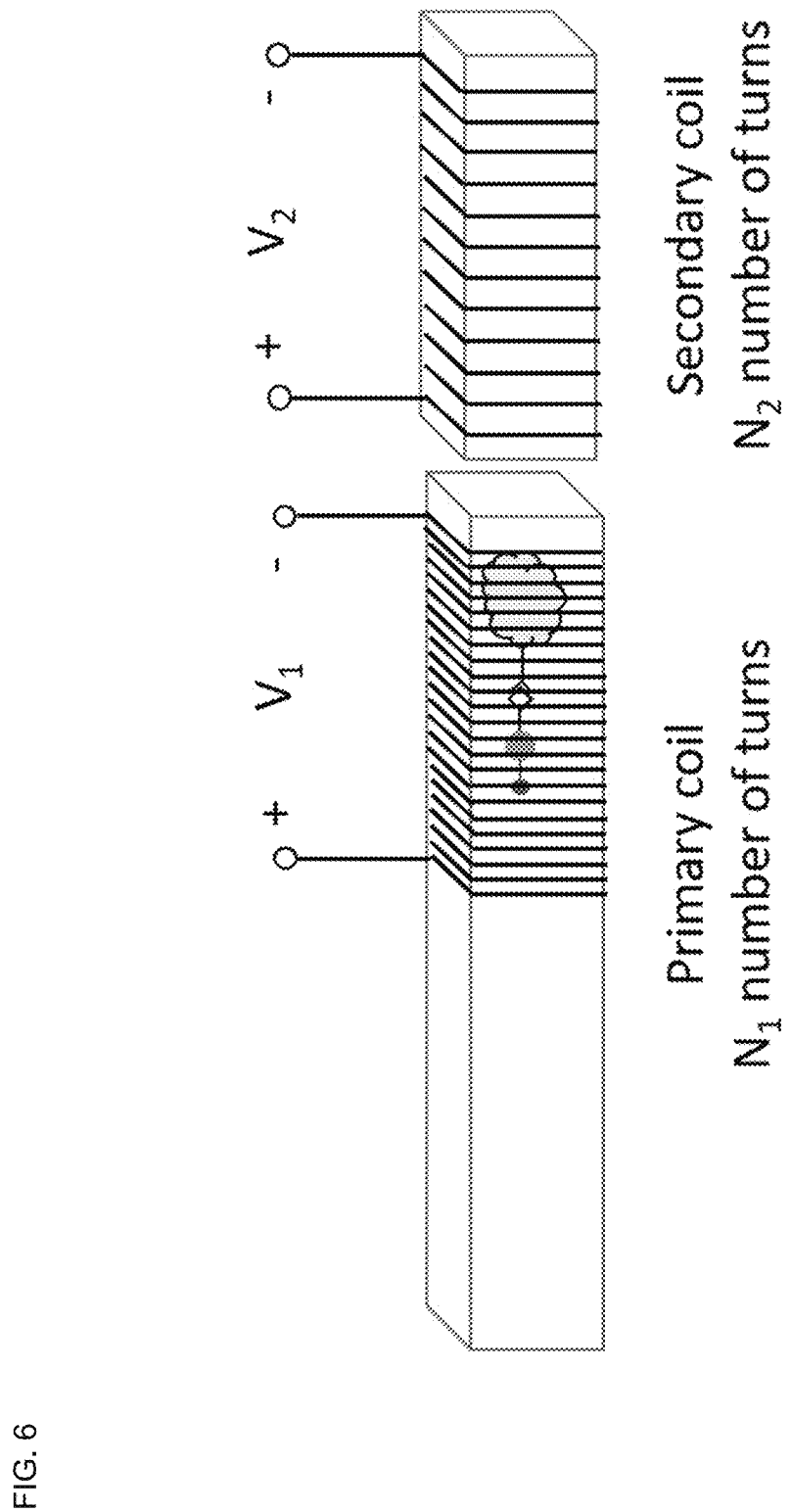
FIG. 6 shows the transformer in FIG. 5 where the cell has entered the primary coil or loop thus triggering the induced voltage, V2, in the secondary coil.
Figure 7:
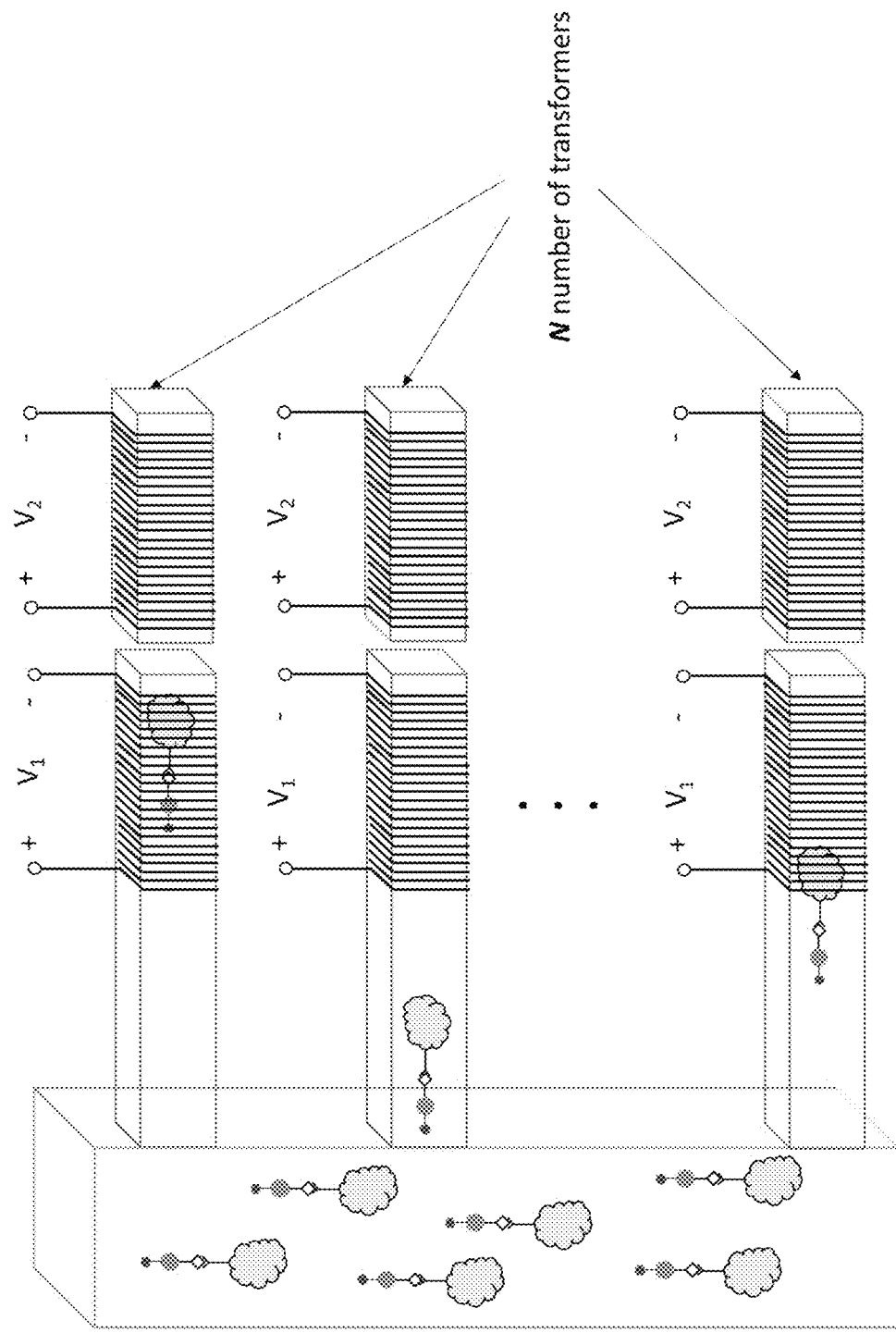
FIG. 7 shows the system schematic in FIG. 4 with the modification of using transformers.

In the main embodiment, two channels act as a transformer, where a secondary microfluidic channel is close to the primary microfluidic channel, as shown in FIGS. 5 and 6. The primary channel has N1 number of magnetic loops, and the secondary channel has N2 number of loops. A voltage V1 is applied to the primary channel, and when the magnetized cell passes through the primary channel, a voltage V2 is induced in the secondary channel, which indicates the presence of a cell. The voltage and current induced depends on the ratio of the number of turns of the coil around each channel. A typical number of turns around each channel ranges from five, ten, or even one hundred turns. As the magnetically coated leukocyte flows into the primary channel, it induces a change in the voltage on the secondary channel, V2, which indicates that a leukocyte has entered. By counting the number of times the output voltage on the secondary coil changes, the device can count the number of leukocytes in the blood sample. The magnetization of the leukocyte triggers the change in the voltage. FIG. 7 shows the microfluidic system with N number of channels with transformers, which enable parallel processing and speeds up the quantification process.

The two channels act as a transformer. As the magnetically coated leukocytes flow into one channel, there is a change in the voltage on the second channel. Counting the number of times the voltage changes translates into the number of leukocytes that flowed through the channel, and hence the number of leukocytes in the sample. The volume of blood required will be about 0.1 ml to about 0.5 ml. A multiplexing method is used for sample detection, using multiple channels. The total blood sample collected is equally distributed to each detection channel. In one embodiment there are 100 channels for detection, so each channel is filled with about 1 microliter to 5 microliters of blood. In other embodiments, there are from 1 to 100 channels for detection, including each whole number from 1 to 100. For example, there may be 1, 2, 3, 4, 5, etc. up to 95, 96, 97, 98, 99, or 100 channels for detection.

Figure 8:
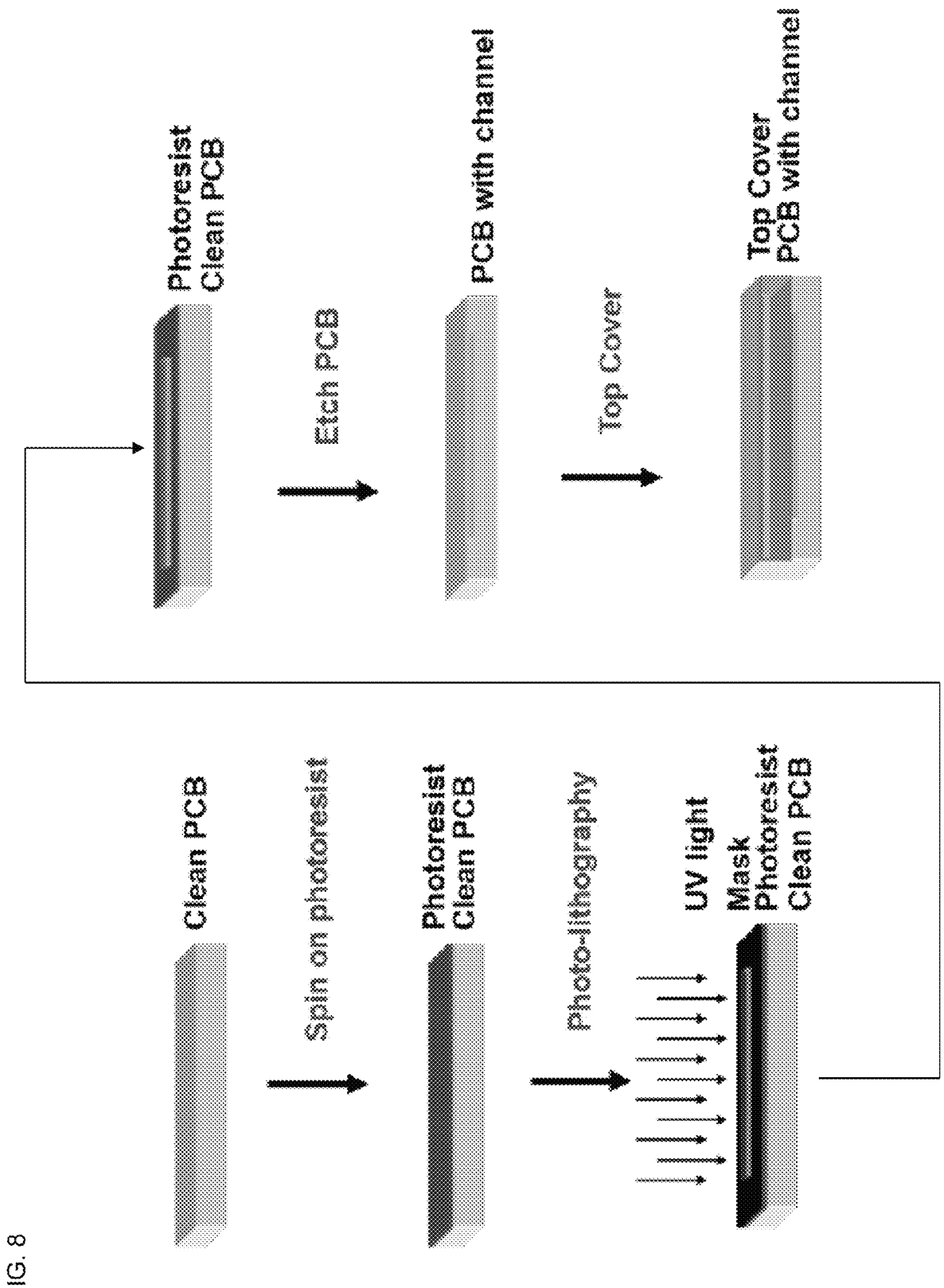
FIG. 8 shows the fabrication steps of the microfluidic channel.
Figure 9:
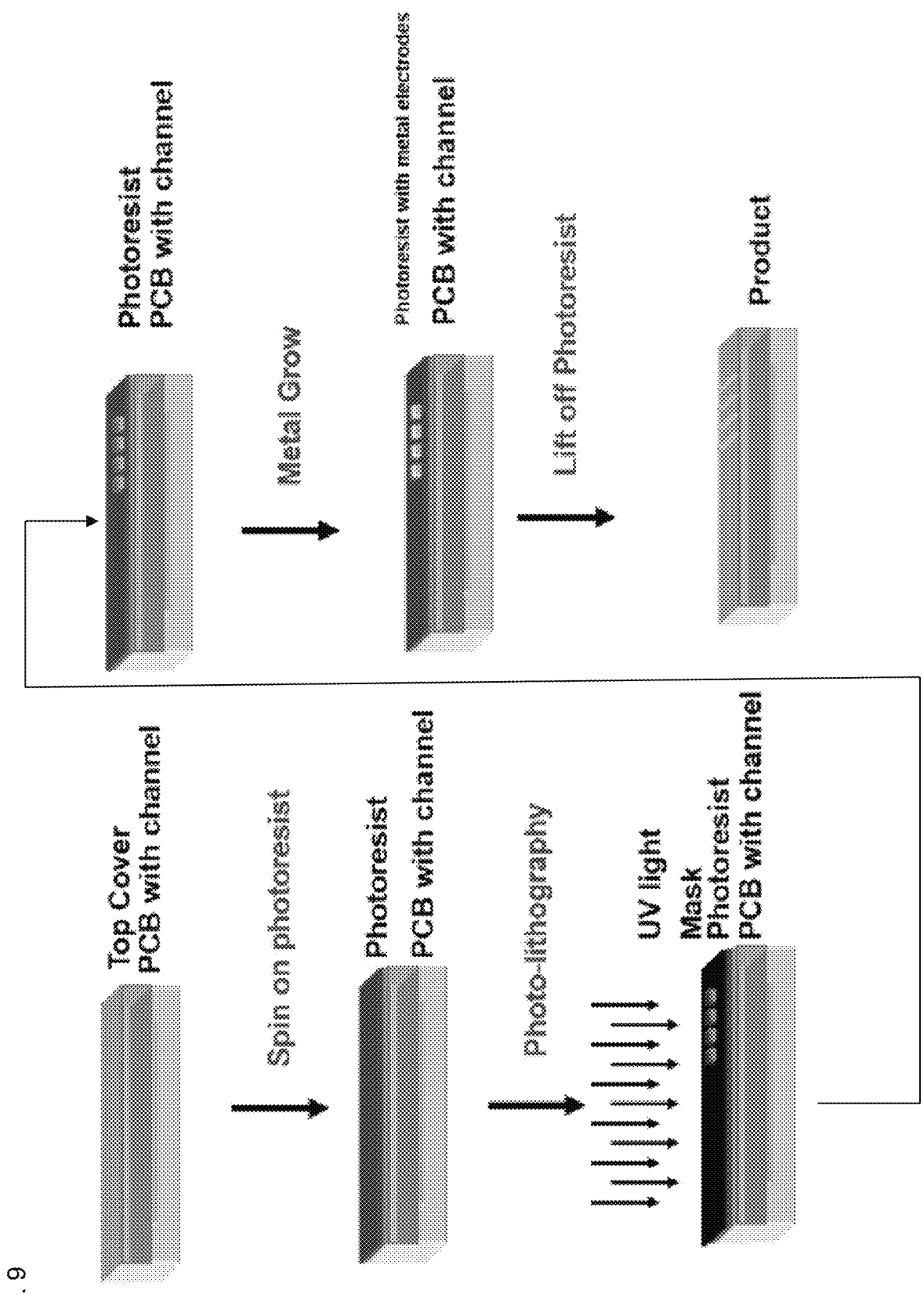
FIG. 9 shows the fabrication steps of the microfluidic device.

The fabrication process is illustrated in FIGS. 8 and 9. FIG. 8 shows how the microfluidic channel is fabricated on the PCB. As shown in FIG. 8, a PCB is cleaned using standard semiconductor manufacture standards and is used for sequential microfabrication processes. A photoresist material is spun on the PCB. A mask with the design of microfluidic channels is used with ultraviolet light to pattern photoresist material. The patterned photoresist is developed and the pattern of channels transferred to the PCB. The patterned PCB is etched based on the pattern; afterward, the photoresist is stripped out of the substrate using solvents such as 1-methyl-2-pyrrolidon (NMP), dimethyl sulfoxide (DMSO), AZ 100 remover, etc. Another PCB without any pattern is placed on top of the PCB with etched channel and seals the channel.

FIG. 9 shows the integration of the top cover PCB with metal coils covering the bottom half of the microfluidic channel. Photolithography and metal deposition are used to fabricate the coils that form the transformer around a channel. As shown in FIG. 9, the PCB chip fabricated from the previous process is used for sequential metal coils fabrication. A photoresist material is spun on top of the PCB chip. A mask with the design of metal coils is used with UV light to pattern photoresist material. The patterned photoresist is developed and the pattern of coils transferred to PCB. Gold metal is deposited to the substrate; other metals that may be used include but are not limited to copper, aluminum, chrome, titanium, and nickel iron. Photoresist is stripped out from the PCB chip. Metal electrodes show on the PCB device.

FIG. 10 shows the entire device with the inlet for the sample application site, and the outlet reservoir where the cells that have been counted are stored. The main microfluidic channel and one of the N number of branch channels with coils is shown. However, as shown in FIG. 4 and FIG. 7, multiple branch channels with coils can be branched off from the main microfluidic channel.

Vertical interconnect accesses (VIA), electrical connections between layers in a printed circuit board that goes through the plane of one or more adjacent layers, connect the top and bottom metal electrodes to form a closed loop of metal coil, as FIG. 11 shows. Vias are thin metallic cylindrical pins inserted in a PCB to connect the top and bottom conductors. The metals that are used to make the vias can be of any conductive metal including copper. The top and bottom PCBs have horizontal metallic, conductive traces etched onto them. The top PCB has conductive traces facing downward, and the bottom PCB has conductive traces facing upward, that are aligned with the top PCB. Then, metallic vias are used to connect either ends of the horizontal metal traces on the top PCB and the bottom PCB to complete one coil. More loops can induce higher voltage or current, which will provide a higher signal to noise ratio. In the figures, there are multiple loops to induce a higher voltage.

An analyzing unit is integrated with the above mentioned microfluidic device. The analyzing unit includes a chip holder to hold and convey the chip into the unit, as FIG. 11 shows. The voltage and/or current outputted from the microfluidic device is inputted into a circuit in the analyzing unit that counts the number of times the voltage/current changes. The counter then relays the number of counts into a chip that stores the information as digital bits. The fabrication method includes a counting system to convert voltage and/or current to number of cells.

The invention uses the permeability of the magnetic material bound to the protein that attaches to the white blood cell to create a change in the magnetic field in the coil. This change of the magnetic field induces a change in current, which is the claimed sensing mechanism of the presence of a white blood cell. Multiple white blood cells bind to multiple magnetic material, creating a larger change in the magnetic field and a larger change in the current in the coils. Thus a larger change in magnetic field or current represents a count of white blood cells greater than one. The inventive method fabricates a coil wrapped around a microfluidic channel using conductive wires and conductive vias to complete the closed conductive loop around the microfluidic channel.

The embodiments shown and described in the specification are only specific embodiments of inventors who are skilled in the art and are not limiting in any way. Therefore, various changes, modifications, or alterations to those embodiments may be made without departing from the spirit of the invention in the scope of the following claims. The references cited are expressly incorporated by reference herein in their entirety.

[1] Luharuka et al., Simulated and experimental dynamic response characterization of an electromagnetic microvalve, *Sensors Actuators A Phys.*, vol. 143, no. 2, pp. 399-408, 2008.

[2] Owen et al., Rapid microfluidic mixing via rotating magnetic microbeads, *Sensors Actuators A Phys.*, vol. 251, pp. 84-91, 2016.

[3] Kommandur et al., Metal-coated glass microfiber for concentration detection in gas mixtures using the 3-Omega excitation method, *Sensors Actuators A. Phys.*, vol. 250, pp. 243-249, October 2016.

[4] P. (Atlanta Hesketh Ga.), S. (Atlanta Nair Ga.), K. (Bartlesville McCarley Okla.), M. (Atlanta Navaei Ga.), K. (Bartlesville Bagnall Okla.), and A. (Atlanta Venkatasubramanian Ga.), "High-pressure quartz crystal microbalance," 2014.

[5] Ballard et al. Orbiting magnetic microbeads enable rapid microfluidic mixing, *Microfluid. Nanofluidics VO—20*, no. 6, p. 1, 2016.

[6] T. J. (Weybridge) Hesketh, R. P. (London) Lindstedt, and I. A. B. (Southfields) Reid, "Mixing apparatus for gases," 2013.

[7] Hesketh et al., The development and multiple uses of a standardised bioassay method to select hypocrealean fungi for biological control of aphids, Biol. Control, vol. 46, pp. 242-255, January 2008.

[8] Luharuka and Hesketh, Design of fully compliant, in-plane rotary, bistable micromechanisms for MEMS applications, Sensors Actuators A. Phys., vol. 134, no. International Mechanical Engineering Congress and Exposition 2005 (American Society of Mechanical Engineering), pp. 231-238, 2007.

[9] M. D. (Pleasanton Allendorf Calif.) and P. J. (Atlanta Hesketh Ga.), Method and apparatus for detecting an analyte, 2011.

[10] Venkatasubramanian et al., MOF@MEMS: Design optimization for high sensitivity chemical detection, Sensors Actuators B. Chem., vol. 168, pp. 256-262, June 2012.

[11] Brazzle et al., Hollow Metallic Micromachined Needle Arrays, Biomed. Microdevices, vol. 2, no. 3, p. 197, June 2000.

[12] "Electric impedance spectroscopy using microchannels with integrated metal electrodes," J. Microelectromechanical Syst. Microelectromechanical Syst. J. of, J. Microelectromech. Syst. VO-8, no. 1, p. 50, 1999.

[13] A. B. (Mableton Frazier Ga.) and J. D. (Clearfield Brazzle Utah), "Surface micromachined microneedles," 2006.

[14] Beavis et al., P-4.10: Quantitation of leukocyte subsets in non-human primate peripheral blood using a single-tube, 8-colour flow cytometry assay, Toxico. Lett., vol. 229, Supplement p. S206, September 2014.

[15] Hosseini et al., Microfluidic device for label-free quantitation and distinction of bladder cancer cells from the blood cells using micro machined silicon based electrical approach; suitable in urinalysis assays, J. Pharm. Biomed. Anal., vol. 134, pp. 36-42, 2017.

[16] Differential immuno-capture biochip offers specific leukocyte counting for HIV diagnosis, AIDS Weekly, NewsRX LLC, 2016.

[17] Hassan et al., Microfluidic differential immunocapture biochip for specific leukocyte counting, Nat. Protoc., vol. 11, no. 4, p. 714, 2016.

[18] Tang et al., Microfluidic impedance cytometer with inertial focusing and liquid electrodes for high-throughput cell counting and discrimination., Anal. Chem. vol. 89, no. 5, p. 3154, 2017.

[19] Hassan and Bashir, Electrical cell counting process characterization in a microfluidic impedance cytometer, Biomed. Microdevices, vol. 16, no. 5, pp. 697-704, 2014.

[20] Damhorst et al., Research: Smartphone-Imaged HIV-1 Reverse-Transcription Loop-Mediated Isothermal Amplification (RT-LAMP) on a Chip from Whole Blood, Engineering, vol. 1, no. Special Section: Medical Instrumentation, pp. 324-335, 2015.

[21] Tay et al., Research review paper: Advances in microfluidics in combating infectious diseases, *Biotechnol. Adv.*, vol. 34, pp. 404-421, July 2016.

[22] Antfolk and Laurel, Review: Continuous flow microfluidic separation and processing of rare cells and bioparticles found in blood-A review, Anal. Chim. Acta, vol. 965, pp. 9-35, May 2017.

[23] Pui et al., High density CMOS electrode array for high-throughput and automated cell counting, Sensors Actuators B. Chem., vol. 181, pp. 842-849, 2013.

[24] Alazzam et al., Novel microfluidic device for the continuous separation of cancer cells using dielectrophoresis, J. Sep. Sci., vol. 40, no. 5, p. 1193, 2017.

[25] L.-Y. (1) Hung et al., "An integrated microfluidic platform for rapid tumor cell isolation, counting and molecular diagnosis," Biomed. Microdevices, pp. 1-14, January 2013.

[26] Sarioglu et al., A microfluidic device for label-free, physical capture of circulating tumor cell clusters, Nat. Methods vol. 12, no. 7, p. 685, 2015.

[27] Terrell-Hall et al., Magnetic permeability across a novel microfluidic blood-tumor barrier model, Fluids Barriers CNS, vol. 14, no. 1, 2017.

[28] Gogoi et al., Development of an Automated and Sensitive Microfluidic Device for Capturing and Characterizing Circulating Tumor Cells (CTCs) from Clinical Blood Samples, PLoS One, vol. 11, no. 1, pp. 1-12, 2016.

[29] Xu et al., A review of impedance measurements of whole cells, Biosens. Bioelectron., vol. 77, pp. 824-836, 2016.

[30] Castillo-Fernandez et al., High-speed counting and sizing of cells in an impedance flow microcytometer with compact electronic instrumentation, Microfluid. Nanofluidics, vol. 16, no. 1-2, p. 91, 2014.

[31] "Findings on Biomedicine and Biomedical Engineering Detailed by Investigators at University of Illinois (Electrical cell counting process characterization in a microfluidic impedance cytometer)," *Biotech Week*, NewsRX LLC, 2014.

[32] L. L. (North A. Chan M A) and J. (North A. Qiu M A), Cell counting and sample chamber and methods of fabrication, 2015.

[33] Dupont et al., Fluorescent magnetic bead and cell differentiation/counting using a CMOS SPAD matrix, Sensors Actuators B. Chem., vol. 174, p. 609, 2012.

[34] Wang et al., Method, Devices, and Systems for Chemiluminescence-based Microfluidic Cell Counting, U.S. Patent Publication 2011/0028341 Feb. 3, 2011.

[35] Kim et al., A portable somatic cell counter based on a multi-functional counting chamber and a miniaturized fluorescence microscope, Talanta, vol. 170, pp. 238-243, 2017.

[36] Battrell et al., Portable High Gain Fluorescence Detection System, U.S. Pat. No. 8,329,453 issued Dec. 11, 2012.

[37] M. K. (1) Shourav, S. (1) Kim, J. K. (1 Kim 2), and K. (2 Kim 3), Wide field-of-view fluorescence imaging with optical-quality curved microfluidic chamber for absolute cell counting, Micromachines, vol. 7, no. 7, 2016.

[38] Janetopoulos et al., Open Microfluidic Devices For Chemotaxis, Methods of Using Same, and Applications of Same, U.S. Patent Publication 2014/0308207, Oct. 16, 2014.

[39] Vazquez et al., A novel procedure of quantitation of virus based on microflow cytometry analysis., Appl. Microbio. Biotechnol, vol. 100, no. 5, pp. 2347-2354, 2016.

[40] Fernandez-Baldo et al., Nanostructured platform integrated into a microfluidic immunosensor coupled to laser-induced fluorescence for the epithelial cancer biomarker determination, Microchem. J., vol. 128, pp. 18-25, 2016.

[41] Garcia et al., Counting cells with a low-cost integrated microfluidics-waveguide sensor, Biomicrofluidics, vol. 6, no. 1, p. 14115, March 2012.

[42] He et al., Digital Microfluidics for Manipulation and Analysis of a Single Cell, Int. J. MoL Sci., vol. 16, no. 9, pp. 22319-22332, 2015.

[43] Liu et al., Microfluidic magnetic bead assay for cell detection, Anal. Chem. vol. 88, p. 711, 2016.

[44] Ouyang et al., Rotation-Driven Microfluidic Disc for White Blood Cell Enumeration Using Magnetic Bead Aggregation, Anal. Chem., vol. 88, no. 22, pp. 11046-11054, 2016.

[45] Liu et al. In situ single cell detection via microfluidic magnetic bead assay, PLoS One, vol. 12, no. 2, pp. 1-18, 2017.

[46] B. (Madison Prabhakarpandian Ala.), K. (Madison Pant Ala.), S. (Tampa Sundaram Fla.), and K. H. (Madison Bhatt Ala.), Synthetic microfluidic blood-brain barrier, 2013.

[47] Ruffert, Magnetic Bead-Magic Bullet., Micromachines, vol. 7, no. 2, p. 1, 2016.

[48] Ho, Micro/Nano Technology Systems for Biomedical Applications: Microfluidics, Optics, and Surface Chemistry. Oxford: OUP Oxford, 2010.

[49] J. M. (Chapel H. DeSimone N.C.), J. P. (Belmont Rolland Mass.), G. M. D. (Durham Rothrock N.C.), and P. (Cary Resnick N.C.), "Methods and materials for fabricating microfluidic devices," 2013.

[50] "Method and materials for fabricating microfluidic devices," 2013.

[51] John Foster et al., Cell sorting system using electromagnetic solenoid, WO 2015/132318, 2015.

[52] Kratt et al., High aspect ratio PMMA posts and characterization method for micro coils manufactured with an automatic wire bonder, Sensors Actuators A. Phys., vol. 156, pp. 328-333, 2009.

[53] Mohmmadzadeh et al., Characterization of a 3D MEMS fabricated micro-solenoid at 9.4 T, J. Magn. Reson., vol. 208, pp. 20-26, 2011.

[54] Spengler et al., Heteronuclear Micro-Helmholtz Coil Facilitates pm-Range Spatial and Sub-Hz Spectral Resolution NMR of nL-Volume Samples on Customisable Microfluidic Chips., PLoS One, vol. 11, no. 1, pp. 1-16, 2016.

[56] Rasera et al., Fabrication of microfluidic vias by mechanical compression and controlled peeling, in 18th International Conference on Miniaturized Systems for Chemistry and Life Sciences, 2014.

[57] Anderson et al., Fabrication of Topologically Complex Three-Dimensional Microfluidic Systems in PDMS by Rapid Prototyping, Anal. Chem., vol. 72, no. 14, pp. 3158-3164, 2000.

[58] Kartalov et al., Microfluidic vias Enable Nested Bio-arrays and Autoregulatory Devices in Newtonian Fluids, Proc. NatL Acad. Sci. United States Am. vol. 103, no. 33, p. 12280, 2006.

[59] Sun et al., Paramagnetic Structures within a Microfluidic Channel for Enhanced Immunomagnetic Isolation and Surface Patterning of Cells, vol. 6, p. 29407, July 2016.

What is claimed is:

1. A quantitation device comprising:
at least one microfluidic solenoid comprising a microfluidic channel and a plurality of conductive coils disposed around at least a portion of the microfluidic channel,
wherein the microfluidic channel defines a passage configured to receive a plurality of particles therethrough;
a source of DC electrical current electrically coupled to the plurality of conductive coils to generate a static magnetic field in the at least one microfluidic solenoid such that a sample containing a plurality of magnetized particles passing through the microfluidic channel in the at least one microfluidic solenoid produces a plurality of discrete voltage changes induced by changes in permeability resulting from the plurality of magnetized particles passing through the microfluidic channel; and
a computing device comprising computer readable instructions that, when executed, cause quantitation of a number of the plurality of discrete voltage changes indicative of the number of particles in the plurality of magnetized particles.

2. The quantitation device of claim 1, wherein the plurality of conductive coils are disposed around at least the portion of the microfluidic channel by:
wrapping the plurality of conductive coils around the at least one microfluidic solenoid and securing the plurality of conductive coils to the microfluidic channel.

3. The quantitation device of claim 1, further comprising a plurality of the microfluidic solenoids electrically interconnected for parallel processing.

4. The quantitation device of claim 1, further comprising a plurality of microfluidic channels.

5. The quantitation device of claim 4, wherein the plurality of microfluidic channels comprise a horizontal array, a vertical array, or both.

6. A method of quantitating target particles in a sample, the method comprising:
fabricating one or more microfluidic solenoids, each of the one or more microfluidic solenoids housing a microfluidic channel therethrough, and each of the one or more microfluidic solenoids having a plurality of conductive coils disposed around the microfluidic channel thereby defining a closed conductive loop around the microfluidic channel;
causing, using a direct current power source in communication with one or more of the conductive coils, a voltage to be applied across the one or more of the conductive coils to generate a static magnetic field in the one or more microfluidic solenoids;
causing a sample comprising a plurality of magnetized particles to flow through one or more of the microfluidic channels, thereby producing a series of discrete changes in voltage provided by the direct current power source in communication with one or more of the conductive coils, the changes in voltage induced by changes in permeability resulting from the magnetized particles flowing therethrough;
quantitating the number of signals where the number of signals correlate in discrete target particle quantitation; and
outputting the resulting target particle quantitation.

7. The method of claim 6, wherein the target particles comprise cells.

8. The method of claim 7, wherein the cells comprise leukocytes.

9. The method of claim 6, wherein the quantitation occurs in the absence of a laser source.

10. The method of claim 6, wherein fabricating one or more microfluidic solenoids comprises:
a) applying a photoresist material on a cleaned printed circuit board;
b) applying a mask with a design of at least one of the microfluidic channels with ultraviolet light to result in a patterned photoresist material;
c) developing a patterned photoresist material;
d) transferring the developed patterned photoresist material to the printed circuit board and etching the pattern to define at least one of the microfluidic channels; and
e) stripping the photoresist material out of the printed circuit board.

11. The method of claim 10, further comprising disposing a second cleaned printed circuit board without a pattern on the printed circuit board with the at least one of the microfluidic channels and sealing the at least one of the microfluidic channels.

12. The method of claim 6, wherein fabricating one or more microfluidic solenoids comprises:
a) applying a photoresist material on a printed circuit board;
b) applying a mask with a design of metal coils with ultraviolet light to pattern the photoresist material;
c) developing the patterned photoresist material and transferring to the printed circuit board;
d) depositing gold metal on the printed circuit board;
e) stripping the photoresist material out of the printed circuit board to show metal electrodes on the printed circuit board; and
f) connecting a top electrode on one printed circuit board to a bottom electrode on an adjacent printed circuit board by a via extending through at least a portion of the printed circuit board to form a closed metal coil loop.

13. A method of sorting, differentiating, and quantitating a plurality of leukocytes in a
patient blood sample, the method comprising:
causing the blood sample to pass through one or more of a plurality of microfluidic
channels of a microfluidic device, wherein the blood sample comprises magnetized leukocytes;
detecting, using a conductive coil disposed around the one or more plurality of microfluidic channels, a discrete change of voltage supplied by a direct current power supply to generate a static magnetic field in the one or more plurality of microfluidic channels; and
quantitating, based on the change of voltage, each magnetized leukocyte in the blood sample.

14. The method of claim 13, wherein the leukocytes are magnetized by binding magnetic-coated nanoparticles to the leukocytes by a receptor protein specific to the leukocyte by antigen-antibody interaction.

* * * * *